United States Patent
Kwon et al.

(10) Patent No.: US 12,396,352 B2
(45) Date of Patent: Aug. 19, 2025

(54) SUBSTRATE INCLUDING LIGHT EMITTING ELEMENTS AND DISPLAY DEVICE INCLUDING THE SAME

(71) Applicant: Samsung Display Co., LTD., Yongin-si (KR)

(72) Inventors: Young Soo Kwon, Hwaseong-si (KR); Sun Young Kwon, Seoul (KR); Min Seok Kim, Uijeongbu-si (KR); Bu Yong Kim, Goyang-si (KR); Song Yi Kim, Suwon-si (KR); Soo Dong Kim, Suwon-si (KR); Su Jin Kim, Seoul (KR); Jin Won Kim, Hwaseong-si (KR); Da Hye Park, Asan-si (KR); Dong Gyu Baeck, Asan-si (KR); Hye Jin Paek, Hwaseong-si (KR); Tae Young Song, Osan-si (KR); Keun Chan Oh, Hwaseong-si (KR); Won Gap Yoon, Suwon-si (KR); Ki Heon Lee, Hwaseong-si (KR); Myung Jin Lee, Hwaseong-si (KR); Hyeok Jin Lee, Seongnam-si (KR); Woo Man Ji, Anyang-si (KR); Ho Yeon Ji, Suwon-si (KR); Yong Seok Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 17/949,851

(22) Filed: Sep. 21, 2022

(65) Prior Publication Data
US 2023/0209959 A1    Jun. 29, 2023

(30) Foreign Application Priority Data
Dec. 29, 2021 (KR) .......................... 10-2021-0190988

(51) Int. Cl.
*H10K 59/38* (2023.01)
*H10K 50/13* (2023.01)

(52) U.S. Cl.
CPC ............. *H10K 59/38* (2023.02); *H10K 50/13* (2023.02)

(58) Field of Classification Search
CPC ...... H10K 59/38; H10K 50/13; H10K 50/854; H10K 50/858; H10K 50/865; H10K 59/00
See application file for complete search history.

(56) References Cited

U.S. PATENT DOCUMENTS

2014/0225102 A1* 8/2014 Ikeda .................. H10H 20/822
257/43
2016/0043146 A1* 2/2016 Uesaka ................ H10K 50/818
257/40

(Continued)

FOREIGN PATENT DOCUMENTS

KR    10-2018-0058208 A    5/2018
KR    10-2019-0090114 A    8/2019
(Continued)

*Primary Examiner* — S M Sohel Imtiaz
(74) *Attorney, Agent, or Firm* — Womble Bond Dickinson (US) LLP

(57) ABSTRACT

A display device includes: a substrate including a first emission area, a second emission area, and a third emission area; a first wavelength conversion pattern overlapping the first emission area; a second wavelength conversion pattern overlapping the second emission area; and a light-transmitting pattern overlapping the third emission area, wherein the first wavelength conversion pattern includes first wavelength shifters configured to convert a first light into a second light, and first scatterers, the second wavelength conversion pattern includes second wavelength shifters configured to convert the first light into a third light, and second scatterers, and a ratio between a concentration of the first (Continued)

wavelength shifters and a concentration of the second wavelength shifters is 1:1.1 to 1:1.3.

26 Claims, 22 Drawing Sheets

(56) References Cited

U.S. PATENT DOCUMENTS

| | | | | |
|---|---|---|---|---|
| 2017/0194387 A1* | 7/2017 | Oh | ........................ | H10K 50/854 |
| 2018/0374409 A1* | 12/2018 | Lee | ........................ | H10K 50/11 |
| 2020/0212113 A1* | 7/2020 | Song | ..................... | H10K 59/122 |
| 2020/0328256 A1* | 10/2020 | Lee | ........................ | H10K 50/84 |

FOREIGN PATENT DOCUMENTS

| | | |
|---|---|---|
| KR | 10-2153629 B1 | 9/2020 |
| KR | 10-2153965 B1 | 9/2020 |

\* cited by examiner

SUBSTRATE INCLUDING LIGHT EMITTING ELEMENTS AND DISPLAY DEVICE INCLUDING THE SAME

CROSS-REFERENCE TO RELATED APPLICATION

This application claims priority to and the benefit of Korean Patent Application No. 10-2021-0190988, filed on Dec. 29, 2021 in the Korean Intellectual Property Office, the content of which is incorporated herein by reference in its entirety.

BACKGROUND

1. Field

The present disclosure relates to a substrate including a light-emitting element and a display device including the substrate.

2. Description of the Related Art

Display devices have become more important as multimedia technology has evolved. Accordingly, a variety of display devices such as liquid-crystal display devices (LCDs) and/or organic light-emitting diode display devices (OLEDs) may be utilized in various electronic devices.

Among display devices, a self-luminous display device includes a self-luminous element, for example, an organic light-emitting element. A self-luminous element may include two opposing electrodes and an emission layer interposed therebetween. For an organic light-emitting element to be a self-luminous element, electrons and holes supplied from the two electrodes are recombined in the emission layer to generate excitons, the generated excitons relax from the excited state to the ground state to thereby emit light.

Such a self-luminous display device generally may not utilize a separate light source such as a backlight unit, and thus self-luminous display devices may generally consume relatively less power, may be relatively light and thin, and may have high-quality characteristics such as relatively wide viewing angles, high luminance and/or contrast, and/or relatively fast response speeds, compared to related art display devices. Accordingly, organic light-emitting display devices are attracting attention as the next generation display device.

SUMMARY

Aspects according to embodiments of the present disclosure are directed toward a substrate including light-emitting elements and a wavelength conversion pattern with improved light conversion efficiency.

Aspects according to embodiments of the present disclosure are directed toward a display device including a wavelength conversion pattern with improved light conversion efficiency.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes: a substrate including a first emission area, a second emission area, and a third emission area; a first wavelength conversion pattern overlapping the first emission area; a second wavelength conversion pattern overlapping the second emission area; and a light-transmitting pattern overlapping the third emission area, wherein the first wavelength conversion pattern includes first wavelength shifters configured to convert a first light into a second light, and first scatterers, the second wavelength conversion pattern includes second wavelength shifters configured to convert the first light into a third light, and second scatterers, and a ratio between a concentration of the first wavelength shifters and a concentration of the second wavelength shifters is 1:1.1 to 1:1.3.

According to another embodiment of the present disclosure, a substrate includes light emitting elements, the substrate including: a first substrate including a first emission area, a second emission area, and a third emission area; a first wavelength conversion pattern overlapping the first emission area; a second wavelength conversion pattern overlapping the second emission area; and a light-transmitting pattern overlapping the third emission area, wherein the first wavelength conversion pattern includes first wavelength shifters configured to convert a first light into a second light, and first scatterers, the second wavelength conversion pattern comprises second wavelength shifters configured to convert the first light into a third light, and second scatterers, a concentration of the second wavelength shifters in the second wavelength conversion pattern is 40 wt % to 45 wt %, and a concentration of the first wavelength shifters in the first wavelength conversion pattern is 35 wt % to 40 wt %.

According to still another embodiment of the present disclosure, a display device includes: a first substrate on which a first light-transmitting area, a second light-transmitting area, and a third light-transmitting area are defined and which has a first surface and a second surface facing oppositely away from the first surface; a first wavelength conversion pattern on the first surface of the first substrate and overlapping the first light-transmitting area; a second wavelength conversion pattern on the first surface of the first substrate and overlapping the second light-transmitting area; and a light-transmitting pattern on the first surface of the first substrate and overlapping the third light-transmitting area, wherein the first wavelength conversion pattern includes a first base resin, first wavelength shifters dispersed in the first base resin and configured to convert a first light into a second light, and first scatterers dispersed in the first base resin, the second wavelength conversion pattern includes a second base resin, second wavelength shifters dispersed in the second base resin and configured to convert the first light into a third light, and second scatterers dispersed in the second base resin, the light-transmitting pattern includes a third base resin and third scatterers dispersed in the third base resin, a thickness of each of the first wavelength conversion pattern and the second wavelength conversion pattern is 8 μm to 12 μm, a ratio between a concentration of the first wavelength shifters in the first wavelength conversion pattern and a concentration of the second wavelength shifters in the second wavelength conversion pattern is 1:1.1 to 1:1.3, the concentration of each of the first wavelength shifters and the second wavelength shifters being measured through inductively coupled plasma mass spectrometer (ICP-MS).

It should be noted that the effects of the present disclosure are not limited to those described, and other effects of the present disclosure will be apparent from description.

BRIEF DESCRIPTION OF THE DRAWINGS

The above and other aspects and features of the present disclosure will become more apparent by describing in more detail example embodiments thereof with reference to the attached drawings, in which.

DETAILED DESCRIPTION

Figure 1:
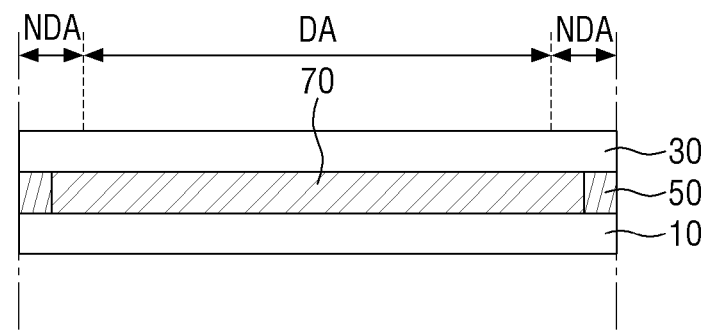
FIG. 1 is a cross-sectional view illustrating a stack structure of a display device according to some embodiments of the present disclosure.

Specific structural and functional descriptions of embodiments of the present disclosure disclosed herein are only for illustrative purposes of the embodiments of the invention. The present disclosure may be embodied in many different forms without departing from the spirit and significant characteristics of the present disclosure. Therefore, the embodiments of the present disclosure are disclosed only for illustrative purposes and should not be construed as limiting the present disclosure. That is, the present disclosure is only defined by the scope of the claims, and equivalents thereof.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" refers to "and/or." As used herein, the term "and/or" includes any and all combinations of one or more of the associated listed items. It will be further understood that the terms "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower," "bottom," "upper," or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" side of the other elements. The example term "lower," can therefore, encompasses both an orientation of "lower" and "upper," depending on the particular orientation in the figure. Similarly, if the device in one of the figures is turned over, elements described as "below" or "beneath" other elements would then be oriented "above" the other elements. The example terms "below" or "beneath" can, therefore, encompass both an orientation of above and below.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes in the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a cross-sectional view illustrating a stack structure of a display device according to some embodiments of the present disclosure.

A display device 1 shown in FIG. 1 may be employed in a variety of electronic devices including small and/or medium sized electronic devices such as a tablet PC, a smartphone, a vehicle navigation unit, a camera, a center information display (CID) installed in vehicles, a wrist-type or kind electronic device (e.g., a smart watch), a personal digital assistant (PMP), a portable multimedia player (PMP) and/or a game machine, and medium and/or large electronic devices such as a television, an electric billboard, a monitor, a personal computer and/or a laptop computer. It should be understood that the above-listed electronic devices are merely illustrative and the display device 1 may be employed in a variety of other suitable electronic devices without departing from the spirit and scope of embodiments according to the present disclosure.

The display device 1 may include a display area DA where images are displayed and a non-display area NDA in which no images are displayed. In some embodiments, the non-display area NDA may be located around the display area DA to surround it. Images displayed on the display area DA may be seen by a user from the side indicated by the arrow in a third direction Z.

In some embodiments, the stack structure of the display device 1 may include a display substrate 10, and a color conversion substrate 30 facing (e.g., opposed to) the display substrate 10, and may further include a sealing member 50 utilized to couple the display substrate 10 with the color conversion substrate 30, and a filler 70 utilized to fill a space or area between the display substrate 10 and the color conversion substrate 30, as shown in FIG. 1.

The display substrate 10 may include elements and circuits for displaying images, e.g., a pixel circuit such as a switching element, a pixel-defining layer for defining an emission area and a non-emission area to be described in more detail later in the display area DA, and a self-luminous (also referred to as self-light-emitting) element. In some embodiments, the self-light-emitting element may include at least one of an organic light-emitting diode, a quantum-dot light-emitting diode, an inorganic-based micro light-emitting diode (e.g., Micro LED), and/or an inorganic-based nano light-emitting diode having a nano size (e.g., Nano LED). In the following description, an organic light-emitting diode will be described as an example of the self-luminous element for convenience of illustration, but embodiments according to the present disclosure are not limited thereto.

The color conversion substrate 30 may be located on the display substrate 10 and may face the display substrate 10. In some embodiments, the color conversion substrate 30 may include a color conversion pattern that converts the color of incident light. In some embodiments, the color conversion substrate 30 may include a color filter and/or a wavelength conversion pattern as the color conversion pattern. In some embodiments, the color conversion substrate 30 may include both (e.g., simultaneously) the color filter and the wavelength conversion pattern.

In the non-display area NDA, the sealing member 50 may be located between the color conversion substrate 30 and the display substrate 10. The sealing member 50 may be arranged or formed along the edges of the display substrate 10 and the color conversion substrate 30 in the non-display area NDA to be around (e.g., surround) the display area DA in a plan view. The display substrate 10 and the color conversion substrate 30 may be coupled to each other via the sealing member 50.

In some embodiments, the sealing member 50 may be made of an organic material. For example, the sealing member 50 may be made of, but the present disclosure is not limited to, an epoxy resin. In some other embodiments, the sealing member 50 may be applicable (e.g., deposited) in the form of a frit including glass and/or the like.

The filler 70 may be located in the space between the display substrate 10 and the color conversion substrate 30 surrounded by the sealing member 50. The filler 70 may be utilized to fill the space between the display substrate 10 and the color conversion substrate 30.

In some embodiments, the filler 70 may be made of a light-transmitting material. In some embodiments, the filler 70 may be made of an organic material. For example, the filler 70 may be made of a silicon-based organic material, an epoxy-based organic material, or a mixture of a silicon-based organic material, an epoxy-based organic material, etc.

In some embodiments, the filler 70 may be made of a material having an extinction coefficient of substantially zero. The refractive index and the extinction coefficient are correlated, and thus the refractive index decreases with the extinction coefficient. When the refractive index is 1.7 or less, the extinction coefficient may converge to substantially zero. In some embodiments, the filler 70 may be made of a material having a refractive index of 1.7 or less. Accordingly, it may be possible to prevent or reduce absorption of light provided by the self-luminous element by the filler 70 when passing through the filler 70. In some embodiments, the filler 70 may be made of an organic material having a refractive index of 1.4 to 1.6.

In FIG. 1, the display device 1 is illustrated as including the display substrate 10, the color conversion substrate 30, the sealing member 50, and the filler 70, but according to some embodiments, the sealing member 50 and the filler 70 may be omitted and elements of the color conversion substrate 30 excluding a second base 310 may be disposed on the display substrate 10.

Figure 2:
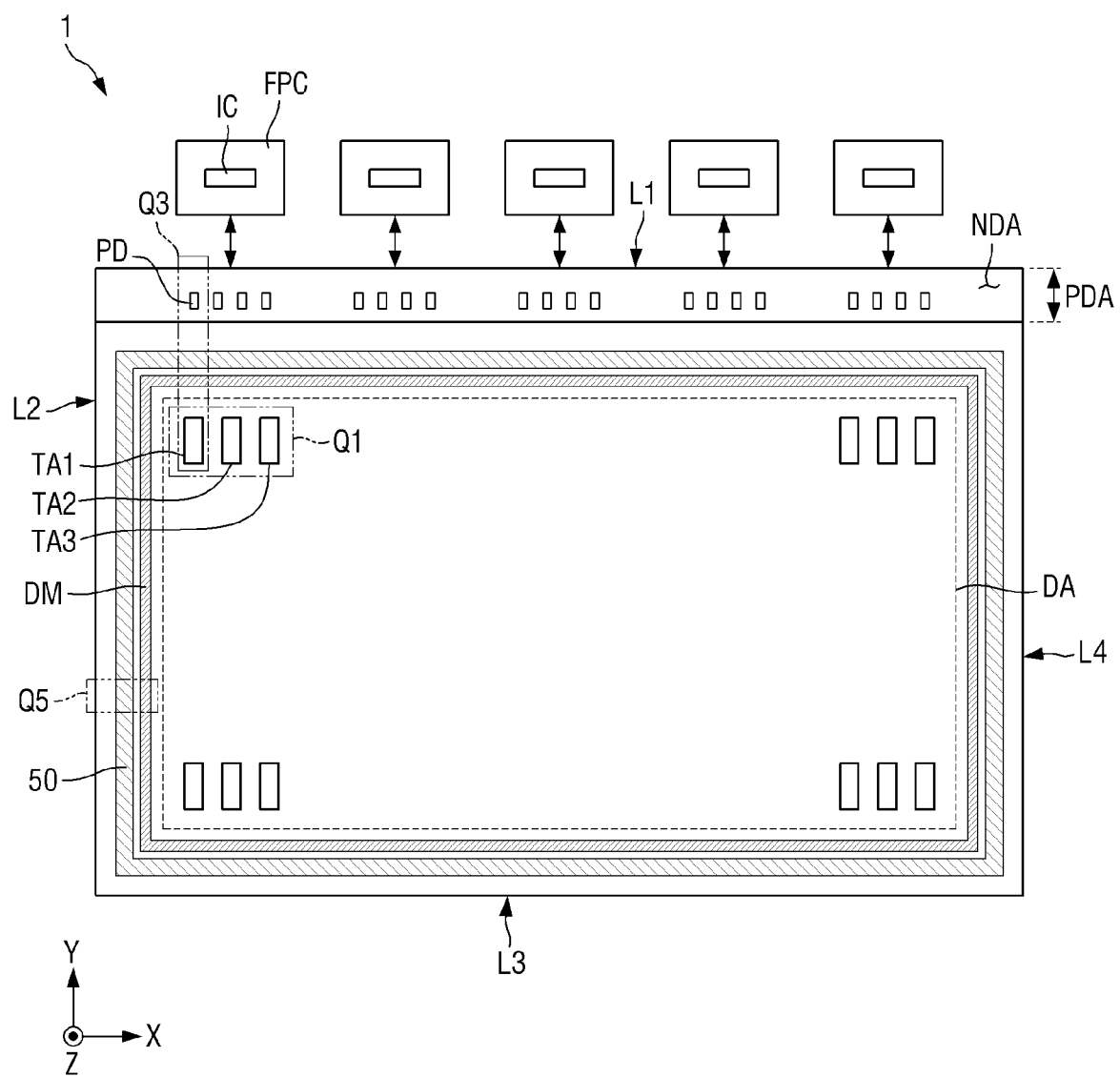
FIG. 2 is a plan view of a display device according to some embodiments of the present disclosure.
Figure 3:
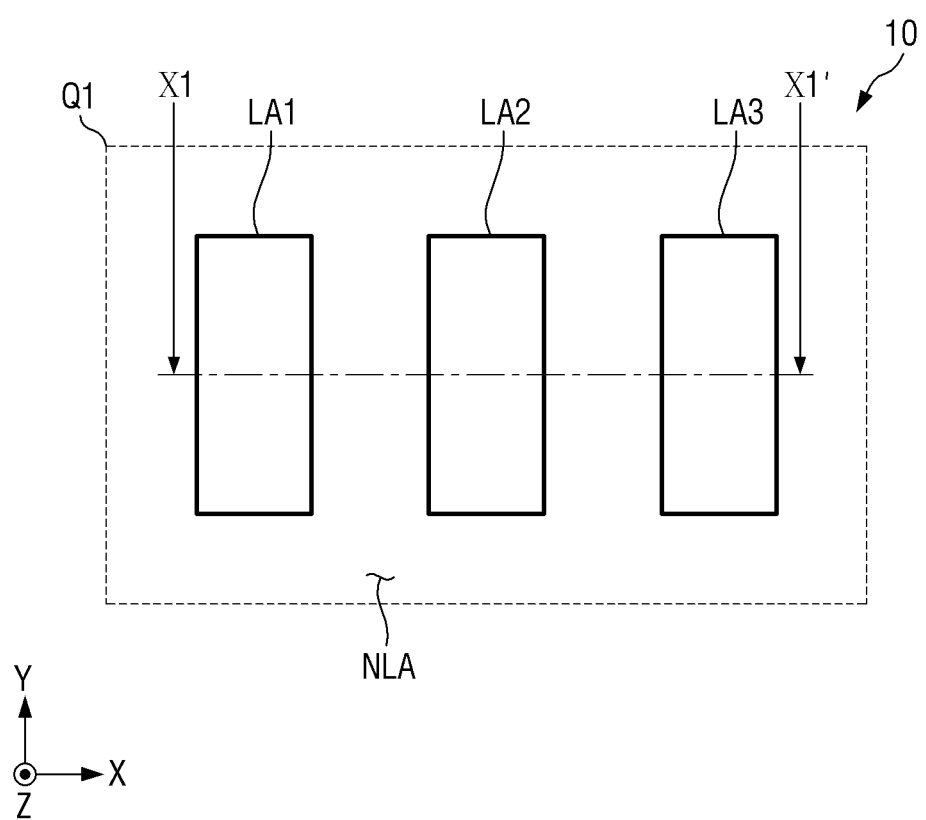
FIG. 3 is an enlarged plan view of portion Q1 of FIG. 2, more specifically, a plan view of a display substrate included in the display device of FIG. 2 according to an embodiment.
Figure 4:
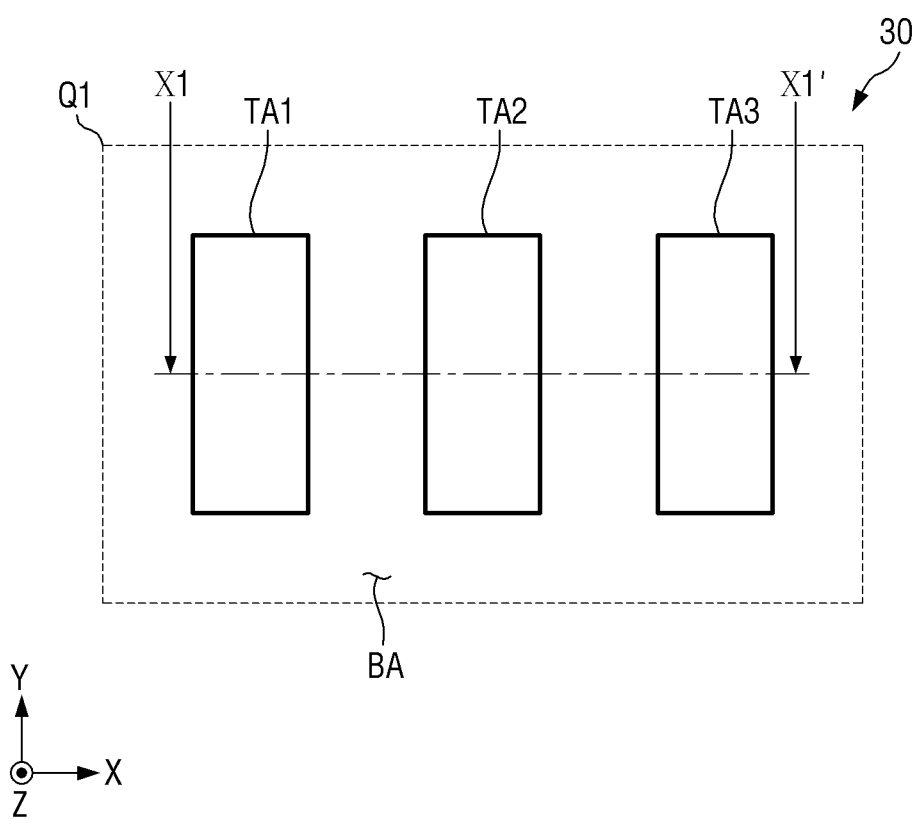
FIG. 4 is an enlarged plan view of portion Q1 of FIG. 2, more specifically, a plan view of a cover conversion substrate included in the display device of FIG. 2 according to an embodiment.
Figure 5:
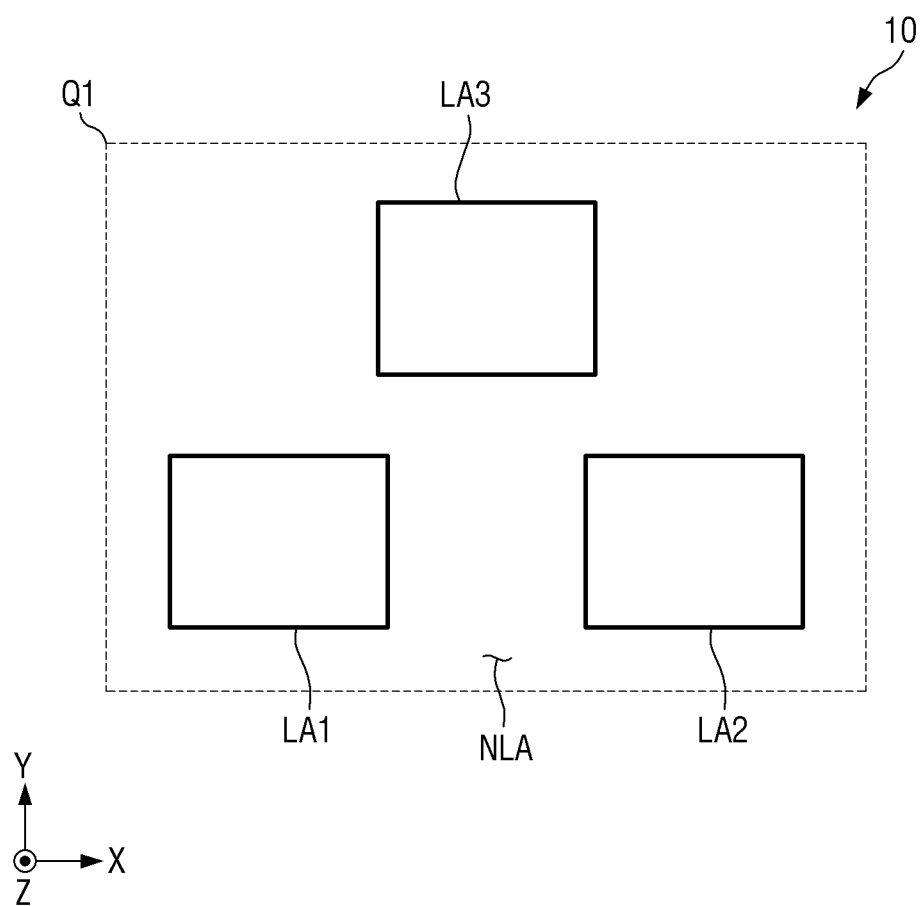
FIG. 5 is a plan view of portion Q1 of FIG. 2 according to an embodiment different from the one shown in FIG. 3.
Figure 6:
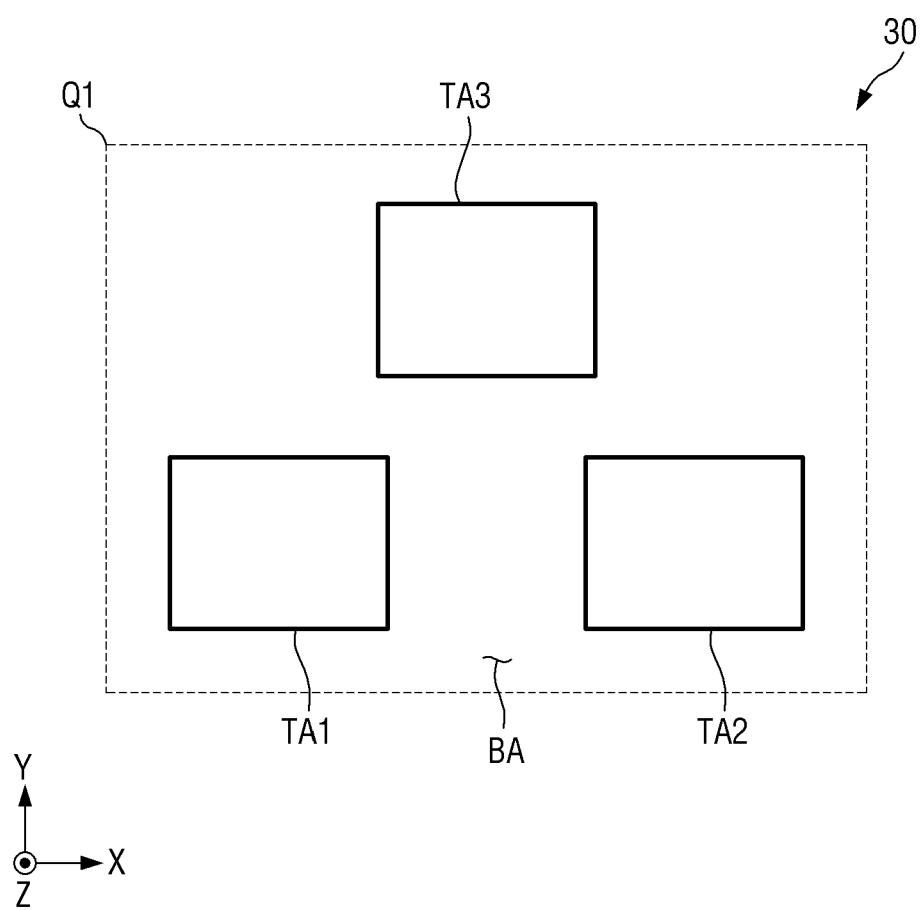
FIG. 6 is a plan view showing a cover conversion substrate included in the display device of FIG. 2 according to an embodiment different from the one shown in FIG. 4.
Figure 7:
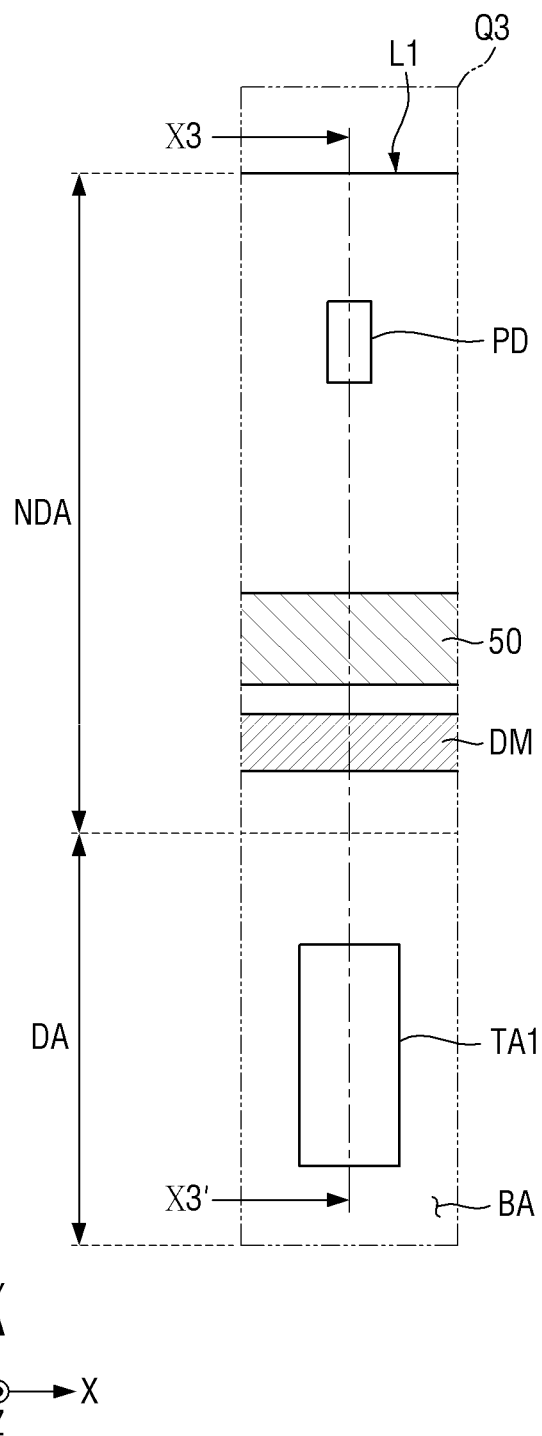
FIG. 7 is an enlarged plan view of portion Q3 of FIG. 2.

FIG. 2 is a plan view of a display device 1 according to some embodiments of the present disclosure. FIG. 3 is an enlarged plan view of portion Q1 of FIG. 2, more specifically, a plan view of a display substrate included in the display device 1 of FIG. 2. FIG. 4 is an enlarged plan view of portion Q1 of FIG. 2, more specifically, a plan view of a color conversion substrate included in the display device of FIG. 2. FIG. 5 is a plan view showing a modification of the example shown in FIG. 3 (e.g., another embodiment). FIG. 6 is a plan view showing a modification of the example shown in FIG. 4 (e.g., another embodiment). FIG. 7 is an enlarged plan view of portion Q3 of FIG. 2.

Referring to FIGS. 2 to 7 in conjunction with FIG. 1, according to some embodiments, the display device 1 may be formed in a rectangular shape in a plan view, as shown in FIG. 2. The display device 1 may include two sides extended in a first direction X, i.e., a first side L1 and a third side L3, and two sides extended in a second direction Y intersecting or crossing the first direction X, i.e., a second side L2 and a fourth side L4. Although the corners where the sides meet each other may form a right angle, the present disclosure is not limited thereto. In some embodiments, the length of the first side L1 and the third side L3 may be different from the length of the second side L2 and the fourth side L4. For example, the first side L1 and the third side L3 may be longer than the second side L2 and the fourth side L4. The shape of the display device 1 in the plan view is not limited to that shown in the drawings. The display device 1 may have a circular shape or other suitable shapes.

In some embodiments, the display device 1 may further include flexible circuit boards FPC and driver chip (e.g., driver chip integrated circuits) ICs.

As shown in FIG. 3, a plurality of emission areas LA1, LA2, and LA3 and a non-emission area NLA may be defined on the display substrate 10 in the display area DA.

In some embodiments, a first emission area LA1, a second emission area LA2, and a third emission area LA3 may be defined in the display area DA of the display substrate 10. In the emission areas LA1, LA2 and LA3, light generated in the light-emitting elements of the display substrate 10 exits (e.g., is emitted) out of the display substrate 10. In the non-emission area NLA, no light exit out of the display substrate 10. In some embodiments, the non-emission area NLA may be around (e.g., surround) the first emission area LA1, the second emission area LA2, and the third emission area LA3 inside the display area DA.

In some embodiments, the light exited (e.g., emitted) out of the first emission area LA1, the second emission area LA2, and the third emission area LA3 may be light of a third color. In some embodiments, the light of the third color may be blue light and may have a peak wavelength in the range of approximately 440 to 480 nm. As used herein, the peak wavelength refers to the wavelength at which the intensity of the light is the greatest.

In some embodiments, the first emission area LA1, the second emission area LA2 and the third emission area LA3 may form a single group (e.g., a repeating unit), and a plurality of such groups may be defined in the display area DA.

In some embodiments, as shown in FIG. 3, the first emission area LA1, the second emission area LA2, and the third emission area LA3 may be located sequentially along the first direction X. In some embodiments, in the display area DA, the first emission area LA1, the second emission area LA2, and the third emission area LA3 may form a single group (e.g., a repeating unit) and may be repeatedly arranged along the first direction X and the second direction Y.

It is, however, to be understood that the present disclosure is not limited thereto. The arrangement of the first emission area LA1, the second emission area LA2, and the third emission area LA3 may be altered in a variety of ways. As shown in FIG. 5, the first emission area LA1 and the second emission area LA2 may be adjacent to each other along the first direction X, while the third emission area LA3 may be located on one side of the first emission area LA1 and the second emission area LA2 along the second direction Y.

In the following description, an example will be described where the first emission area LA1, the second emission area LA2, and the third emission area LA3 are arranged as shown in FIG. 3.

As shown in FIG. 4, a plurality of light-transmitting areas TA1, TA2, and TA3 and a light-blocking area BA may be defined in the color conversion substrate 30 in the display area DA. In the light-transmitting areas TA1, TA2, and TA3, the light emitted from the display substrate 10 may transmit through the color conversion substrate 30 to be provided to the outside of the display device 1. In the light-blocking area BA, the light exiting (e.g., emitted) from the display substrate 10 cannot pass through it.

In some embodiments, a first light-transmitting area TA1, a second light-transmitting area TA2, and a third light-transmitting area TA3 may be defined on the color conversion substrate 30.

The first light-transmitting area TA1 may have the size equal to the size of the first emission area LA1 or may overlap the first emission area LA1. Similarly, the second light-transmitting area TA2 may have the size equal to the size of the second emission area LA2 or may overlap the second emission area LA2, and the third light-transmitting area TA3 may have the size equal to the size of the third emission area LA3 or may overlap the third emission area LA3.

In some embodiments, when the first emission area LA1, the second emission area LA2, and the third emission area LA3 are arranged sequentially along the first direction X as shown in FIG. 3, the first light-transmitting area TA1, the second light-transmitting area TA2, and the third light-transmitting area TA3 may also be arranged sequentially along the first direction X as shown in FIG. 4.

When the first emission area LA1 and the second emission area LA2 are adjacent to each other in the first direction X while the third emission area LA3 is located on one side of the first emission area LA1 and the second emission area LA2 in the second direction Y as shown in FIG. 5, the first light-transmitting area TA1 and the second light-transmitting area TA2 may be adjacent to each other in the first direction X while the third light-transmitting area TA3 may be located on one side of the first light-transmitting area TA1 and the second light-transmitting area TA2 in the second direction Y as shown in FIG. 6.

In some embodiments, the light of the third color provided from the display substrate 10 may pass through the first light-transmitting area TA1, the second light-transmitting area TA2, and the third light-transmitting area TA3 to exit (e.g., to be emitted) out of the display device 1. In the following description, the light exiting out of the display device 1 through the first light-transmitting area TA1 is referred to as a first exiting light, the light exiting out of the display device 1 through the second light-transmitting area TA2 is referred to as a second exiting light, and the light exiting out of the display device 1 through the third light-transmitting area TA3 is referred to as a third exiting light. The first exiting light may be light of a first color, the second exiting light may be light of a second color different from the first color, and the third exiting light may be light of the third color. In some embodiments, the light of the third color may be blue light having a peak wavelength in the range of approximately (about) 440 to (about) 480 nm, and the light of the first color may be red light having a peak wavelength in the range of approximately (about) 610 to (about) 650 nm. In addition, the light of the second color may be green light having a peak wavelength in the range of approximately (about) 510 to (about) 550 nm.

The light-blocking area BA may be located in the display area DA around the first light-transmitting area TA1, the second light-transmitting area TA2, and the third light-transmitting area TA3. In some embodiments, the light-blocking BA may be around (e.g., surround) the first light-transmitting area TA1, the second light-transmitting area TA2, and the third light-transmitting area TA3. In addition, the light-blocking area BA may be located also in the non-display area NDA of the display device 1.

Referring back to FIG. 2, a dam member DM and a sealing member 50 may be located in the non-display area NDA of the display device 1.

The dam member DM may block or reduce the overflow of an organic material (or monomers) in the process of forming an encapsulation layer located in the display area DA, thereby preventing or substantially preventing the organic material in the encapsulation layer from extending (e.g., spreading) toward the edge of the display device 1.

In some embodiments, the dam member DM may be formed to completely surround the display area DA in a plan view.

The sealing member 50 may couple the display substrate 10 with the color conversion substrate 30 as described above.

The sealing member 50 may be located in the non-display area NDA on the outer side of the dam member DM and may be formed to completely surround the dam member DM and the display area DA when viewed from the top (e.g., in a plan view).

The non-display area NDA of the display device 1 may include a pad area PDA, and a plurality of connection pads PD may be located in the pad area PDA.

In some embodiments, the connection pads PD may be located adjacent to a longer side of the non-display area NDA and may be located adjacent to the first side L1 in the non-display area NDA, for example. The connection pads PD may be electrically connected to pixel circuits and/or the like located in the display area DA through connection lines and/or the like.

The display substrate 10 (see, e.g., FIG. 1) of the display device 1 may include the dam member DM and the connection pads PD.

Flexible circuit boards FPC may be connected to the connection pads PD. The flexible circuit boards FPC may electrically connect the display substrate 10 (see, e.g., FIG. 1) with circuit boards that provide signals, power, etc. for driving the display device 1.

Driver chips IC may be electrically connected to the circuit boards and the like to receive data and signals. In some embodiments, the driver chips IC may include a data driver chip and may receive a data control signal and image data from the circuit boards to generate and output a data voltage associated with image data.

In some embodiments, the driver chips IC may be mounted on the flexible circuit boards FPC, respectively. For example, the driver chips IC may be mounted on the flexible circuit boards FPC by a suitable (e.g., known) chip-on-film (COF) technique.

The data voltage supplied from the driver chips IC, the supply voltage supplied from the circuit boards, etc. may be transmitted to the pixel circuit of the display substrate 10 (see, e.g., FIG. 1) through the flexible circuit boards FPC and the connection pads PD.

Hereinafter, the structure of the display device 1 will be described in more detail.

Figure 8:
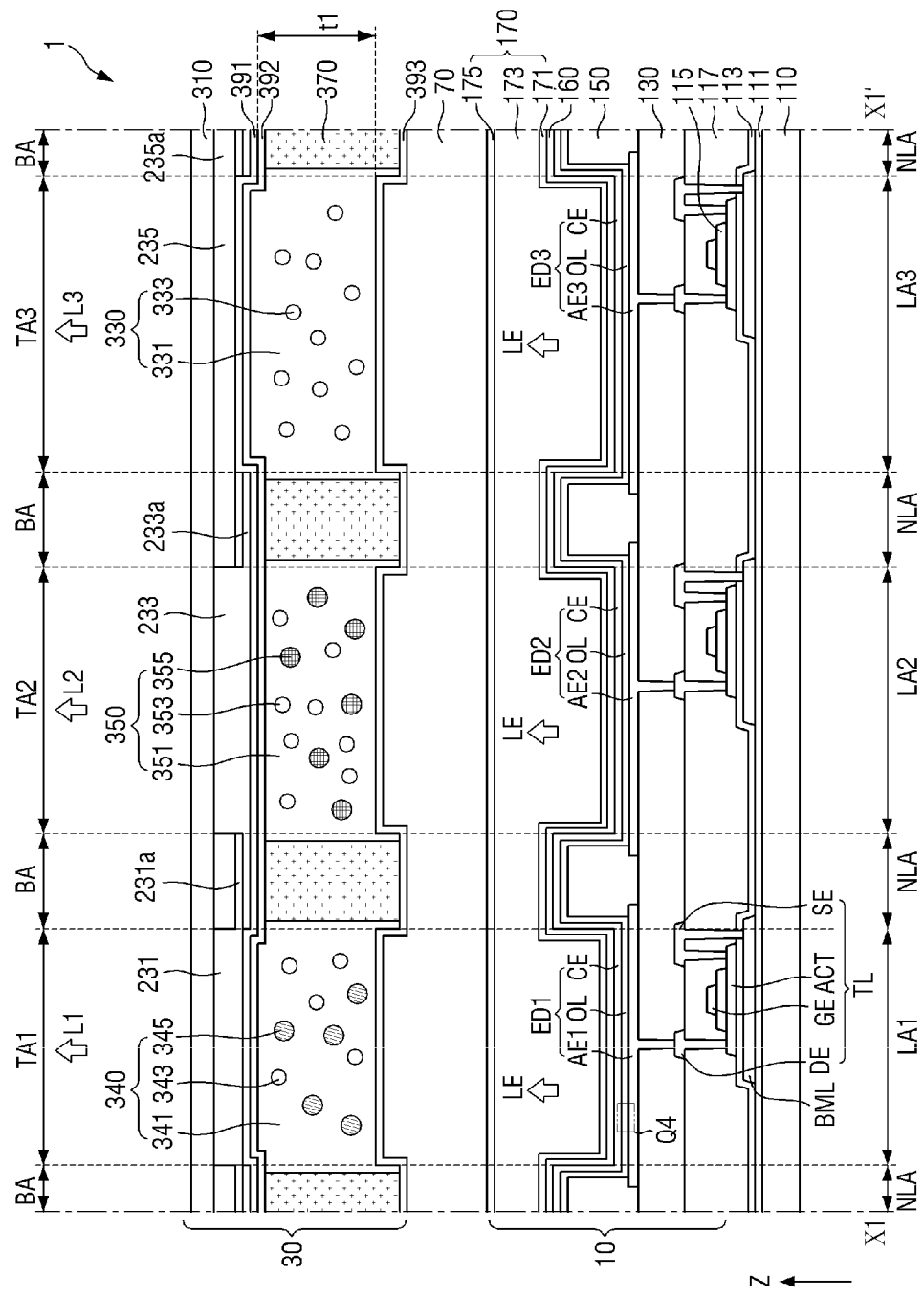
FIG. 8 is a cross-sectional view of the display device according to some embodiments of the present disclosure, taken along the line X1-X1' of FIGS. 3 and 4.
Figure 9:
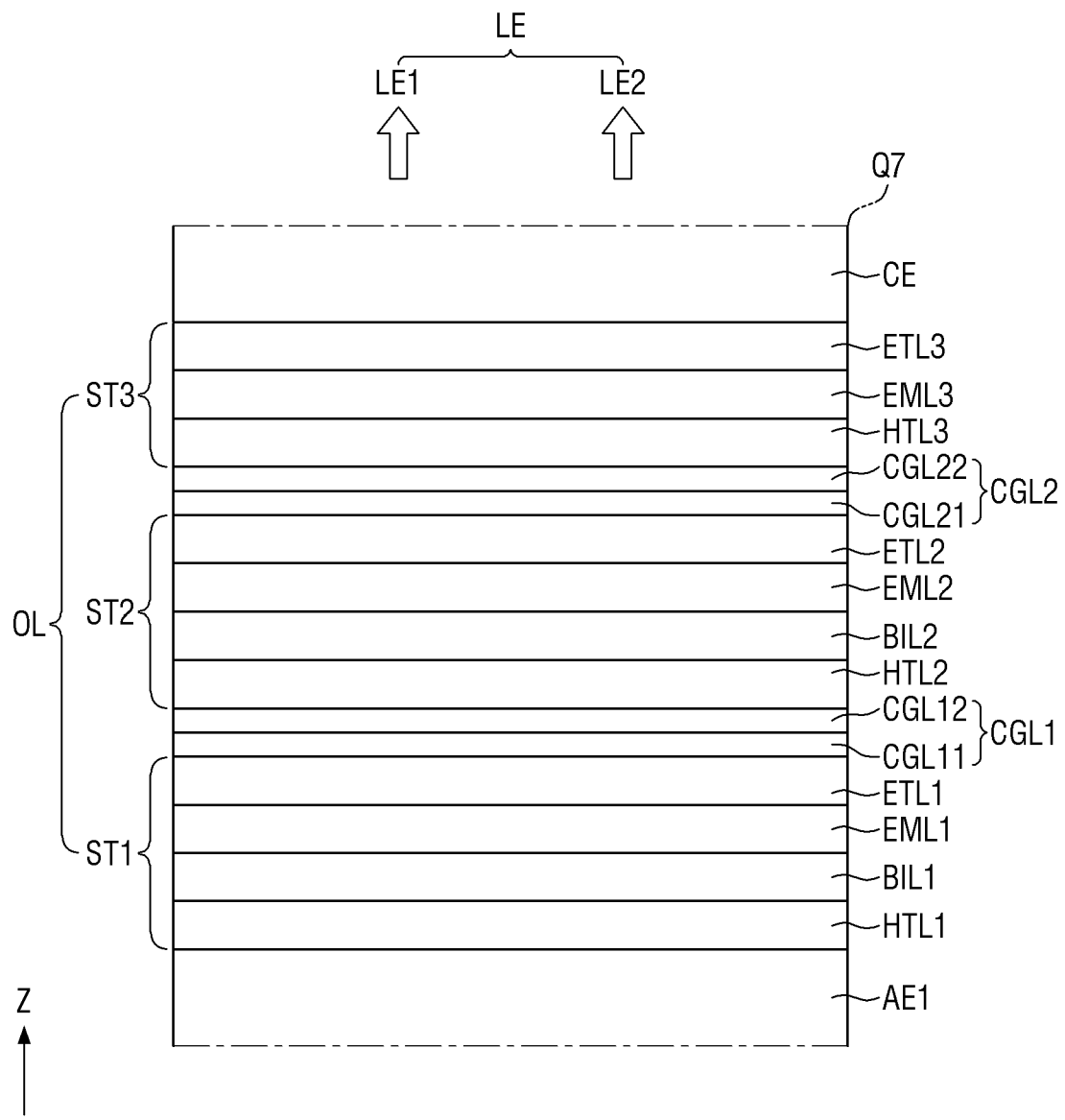
FIG. 9 is an enlarged cross-sectional view of portion Q4 of FIG. 8 according to an embodiment.
Figure 10:
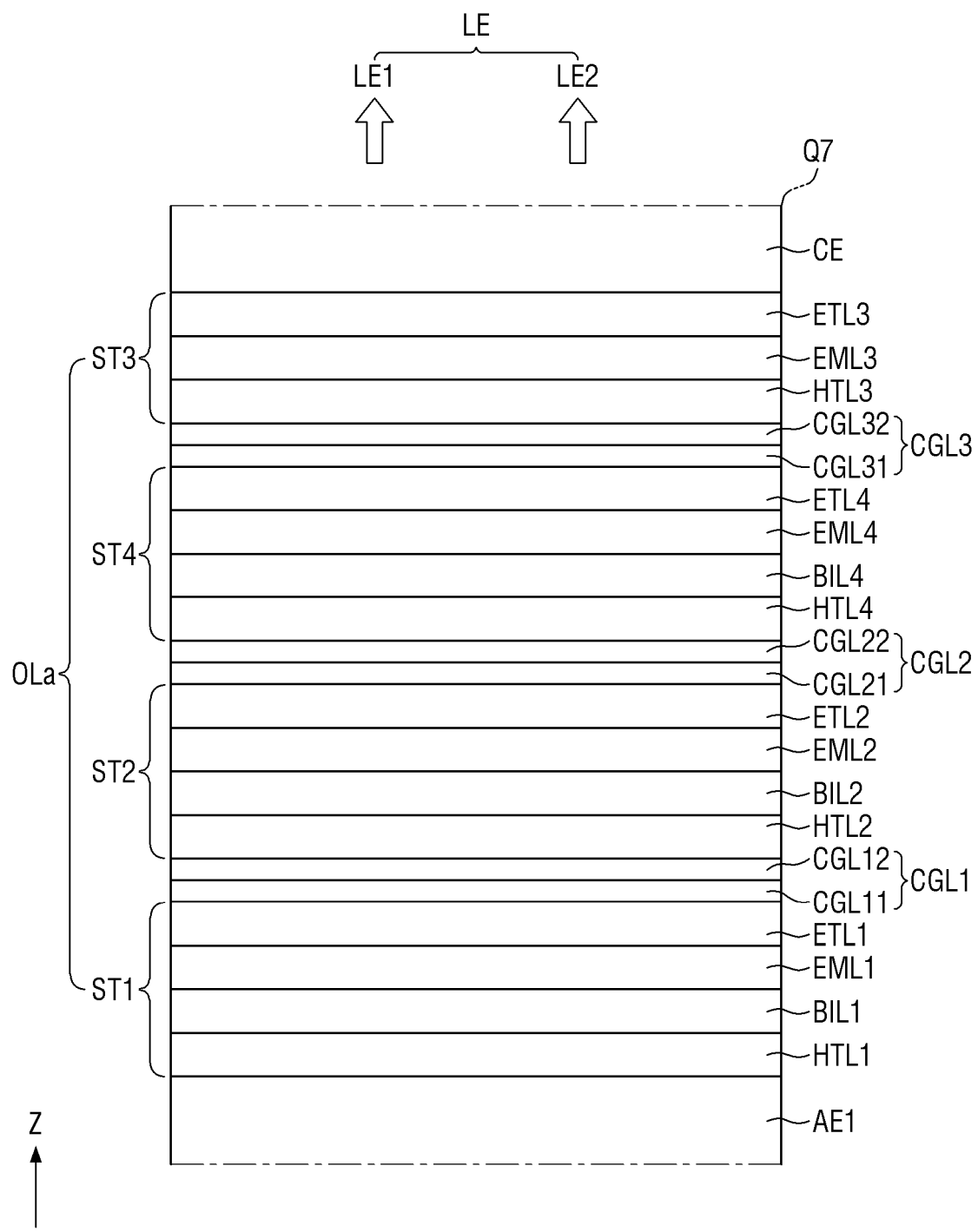
FIG. 10 is a cross-sectional view showing portion Q4 of FIG. 8 according to an embodiment different from the one shown in FIG. 9.
Figure 11:
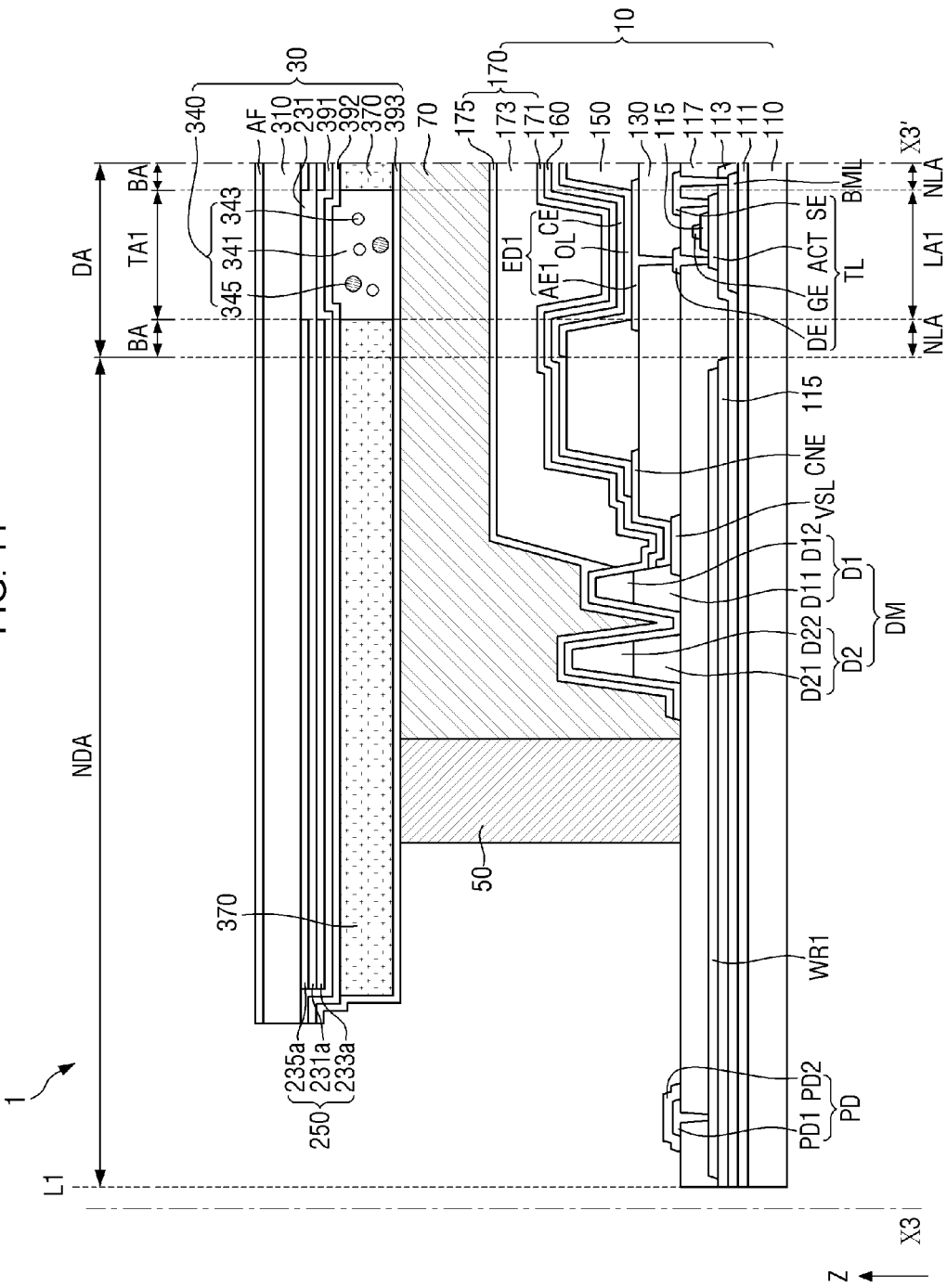
FIG. 11 is a cross-sectional view of the display device according to some embodiments of the present disclosure, taken along the line X3-X3' of FIG. 7.

FIG. 8 is a cross-sectional view of the display device according to some embodiments of the present disclosure, taken along the line X1-X1' of FIGS. 3 and 4. FIG. 9 is an enlarged cross-sectional view of portion Q4 of FIG. 8. FIG. 10 is a cross-sectional view showing a modification of the example of the structure shown in FIG. 9 (e.g., another embodiment). FIG. 11 is a cross-sectional view of the display device according to some embodiments of the present disclosure, taken along the line X3-X3' of FIG. 7.

Referring to FIGS. 8 to 11 in conjunction with FIGS. 1 to 7, the display device 1 may include the display substrate 10 and the color conversion substrate 30 as described above, and may further include the filler 70 located between the display substrate 10 and the color conversion substrate 30.

Hereinafter, the display substrate 10 will be described.

A first base 110 may be made of a light-transmitting material. In some embodiments, the first base 110 may be a glass substrate and/or a plastic substrate. When the first base 110 is a plastic substrate, the first base 110 may have flexibility.

In some embodiments, the plurality of emission areas LA1, LA2, and LA3 and the non-emission area NLA may be defined on the first base 110 in the display area DA, which has been described above.

In some embodiments, the first side L1, the second side L2, the third side L3, and the fourth side L4 of the display device 1 may be identical to the four sides of the first base 110, respectively. That is to say, the first side L1, the second side L2, the third side L3, and the fourth side L4 of the display device 1 may be referred to as the first side L1, the second side L2, the third side L3, and the fourth side L4, of the first base 110, respectively.

A buffer layer 111 may be further located on the first base 110. The buffer layer 111 may be located on the first base 110 in the display area DA and the non-display area NDA. The buffer layer 111 may block foreign substances and/or moisture from permeating through the first base 110. For example, the buffer layer 111 may include an inorganic material such as $SiO_2$, SiNx, and/or SiON, and may be made of a single layer or multiple layers.

A lower light-blocking layer BML may be located on the buffer layer 111. The lower light-blocking layer BML may block external light or light from the light-emitting element from entering a semiconductor layer ACT, which will be described in more detail later, thereby preventing or reducing leakage current from being generated by light in a thin-film transistor TL, which will be described in more detail later.

In some embodiments, the lower light-blocking layer BML may be made of a material that blocks light and has conductivity (e.g., is a conductor). For example, the lower light-blocking layer BML may include a single material of metals such as silver (Ag), nickel (Ni), gold (Au), platinum (Pt), aluminum (Al), copper (Cu), molybdenum (Mo), titanium (Ti) and/or neodymium (Nd), and/or an alloy thereof. In some embodiments, the lower light-blocking layer BML may have a single layer or multi-layer structure. For example, when the lower light-blocking layer BML has a multi-layer structure, the lower light-blocking layer BML may be, but the present disclosure is not limited to, a stack structure of titanium (Ti)/copper (Cu)/indium tin oxide (ITO) or a stack structure of titanium (Ti)/copper (Cu)/aluminum oxide ($Al_2O_3$).

In some embodiments, the display substrate 10 may include a plurality of lower light-blocking layers BML. The number of the lower light-blocking layers BML may be equal to the number of the semiconductor layers ACT. Each of the lower light-blocking layers BML may overlap a respective one of the semiconductor layers ACT. In some embodiments, the width of the lower light-blocking layers BML may be greater than that of the semiconductor layers ACT.

In some embodiments, the lower light-blocking layer BML may be a part of a data line, a voltage supply line, a line that electrically connects a thin-film transistor with the thin-film transistor TL shown in the drawing, etc. In some embodiments, the lower light-blocking layer BML may be made of a material having a lower resistance than a second conductive layer or the source electrode SE and the drain electrode DE included in the second conductive layer.

A first insulating layer 113 may be located on the lower light-blocking layer BML. In some embodiments, the first insulating layer 113 may be located in the display area DA and the non-display area NDA. The first insulating layer 113 may cover the lower light-blocking layer BML. In some embodiments, the first insulating layer 113 may include an inorganic material such as $SiO_2$, $SiN_x$, SiON, $Al_2O_3$, $TiO_2$, $Ta_2O$, $HfO_2$, $ZrO_2$, and/or the like.

The semiconductor layers ACT may be located on the first insulating layer 113. In some embodiments, the semiconductor layers ACT may be located in the first emission area LA1, the second emission area LA2, and the third emission area LA3 in the display area DA, respectively.

In some embodiments, the semiconductor layer ACT may include an oxide semiconductor. For example, the semiconductor layer ACT may be made of Zn oxide, In—Zn oxide, Ga—In—Zn oxide, etc., as a Zn oxide-based material, and, for example, may be an IGZO (In—Ga—Zn—O) semiconductor containing a metal such as indium (In), and/or gallium (Ga) in ZnO. It is, however, to be understood that the present disclosure is not limited thereto. The semiconductor layers ACT may include amorphous silicon or polysilicon.

In some embodiments, the semiconductor layers ACT may be disposed to overlap the lower light-blocking layers BML, respectively, thereby suppressing generation of photocurrent in the semiconductor layers ACT.

A first conductive layer may be formed on the semiconductor layer ACT, and the first conductive layer may include the gate electrode GE and a first gate metal WR1. The gate electrode GE is located in the display area DA to overlap the respective semiconductor layer ACT. As shown in FIG. 11, the first gate metal WR1 may include a part of the line that electrically connects the connection pad PD (see, e.g., FIG. 2) with the elements located in the display area DA (see, e.g., FIG. 2), e.g., the thin-film transistor TL, the light-emitting element, etc.

The gate electrode GE and the first gate metal WR1 may include at least one of the materials including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and/or copper (Cu), and may be made of a single layer or multiple layers, taking into account adhesion to adjacent layers, surface flatness for a layer to be laminated thereon, workability, etc.

In the display area DA, a gate insulating layer 115 may be located between the semiconductor layer ACT and the first conductive layer or between the semiconductor layer ACT and the gate electrode GE. In some embodiments, the gate electrode GE and the gate insulating layer 115 may work (e.g., serve) as a mask for masking a channel region of the semiconductor layer ACT, and the width of the gate electrode GE and the width of the gate insulating layer 115 may be smaller than the width of the semiconductor layer ACT.

In some embodiments, the gate insulating layer 115 may not be formed as a single layer on the entire surface of the first base 110 but may be formed in a partially patterned shape. In some embodiments, the width of the patterned gate insulating layer 115 may be larger than the width of the gate electrode GE or the first conductive layer.

In some embodiments, the gate insulating layer 115 may include an inorganic material. For example, the gate insulating layer 115 may include the inorganic materials listed above as the materials of the first insulating layer 113.

In the non-display area NDA, the gate insulating layer 115 may be located between the first gate metal WR1 and the first insulating layer 113.

A second insulating layer 117 covering the semiconductor layer ACT and the gate electrode GE may be formed over the gate insulating layer 115. The second insulating layer 117 may be located in the display area DA and the non-display area NDA. In some embodiments, the second insulating layer 117 may work as a planarization layer providing a flat surface.

In some embodiments, the second insulating layer 117 may include an organic material. For example, the second insulating layer 117 may include at least one of photo acryl (PAC), polystyrene, polymethyl methacrylate (PMMA), polyacrylonitrile (PAN), polyamide, polyimide, polyarylether, heterocyclic polymer, parylene, fluorine-based polymer, epoxy resin, benzocyclobutene series resin(s), siloxane series resin(s), or silane resin, but the present disclosure is not limited thereto. In some embodiments, the second insulating layer 117 may also include an inorganic material.

The second conductive layer may be formed on the second insulating layer 117, and the second conductive layer may include the source electrode SE, the drain electrode DE, the voltage supply line VSL, and a first pad electrode PD1 of the connection pads PD.

The source electrode SE and the drain electrode DE may be located in the display area DA and may be spaced apart from each other.

The drain electrode DE and the source electrode SE may each pass (e.g., penetrate) through the second insulating layer 117 and be connected to the semiconductor layer ACT.

In some embodiments, the source electrode SE may pass (e.g., penetrate) through the first insulating layer 113 and the second insulating layer 117 and be connected to the lower light-blocking layer BML. When the lower light-blocking layer BML is a part of a line that transmits a signal and/or a voltage, the source electrode SE may be connected to and electrically coupled with the lower light-blocking layer BML and may receive the voltage applied to the line. In some embodiments, when the lower light-blocking layer BML is a floating pattern rather than a separate line, a voltage applied to the source electrode SE and/or the like may be transmitted to the lower light-blocking layer BML.

In some embodiments, unlike the example shown in FIG. 8, the drain electrode DE may pass (e.g., penetrate) through the first insulating layer 113 and the second insulating layer 117 and may be connected to the lower light-blocking layer BML. When the lower light-blocking layer BML is not a line receiving a separate signal, a voltage applied to the drain electrode DE and/or the like may be transmitted to the lower light-blocking layer BML.

The semiconductor layer ACT, the gate electrode GE, the source electrode SE and the drain electrode DE may form the thin-film transistor TL which is a switching element. In some embodiments, the thin-film transistor TL may be located in each of the first emission area LA1, the second emission area LA2 and the third emission area LA3. In some embodiments, a part of the thin-film transistor TL may be located in the non-emission area NLA.

The voltage supply line VSL may be located in the non-display area NDA. A supply voltage applied to a cathode electrode CE, for example, a voltage ELVSS, may be supplied to the voltage supply line VSL.

The first pad electrode PD1 of the connection pads PD may be located in the pad area PDA (see, e.g., FIG. 2) of the non-display area NDA. In some embodiments, the first pad electrode PD1 may pass (e.g., penetrate) through the second insulating layer 117 and may be electrically connected to the first gate metal WR1.

The source electrode SE, the drain electrode DE, the voltage supply line VSL, and the first pad electrode PD1 of the connection pad PD may each include aluminum (Al), copper (Cu), titanium (Ti), etc., and may be made of multiple layers or a single layer. In some embodiments of the present disclosure, the source electrode SE, the drain electrode DE, the voltage supply line VSL and the first pad electrode PD1 of the connection pad PD may each be made of a multilayer structure of Ti/Al/Ti.

A third insulating layer 130 may be located on the second insulating layer 117. The third insulating layer 130 may cover the thin-film transistor TL in the display area DA and may expose a part of the voltage supply line VSL in the non-display area NDA.

In some embodiments, the third insulating layer 130 may be a planarization layer. In some embodiments, the third insulating layer 130 may be made of an organic material. For example, the third insulating layer 130 may include an acrylic resin, an epoxy resin, an imide resin, an ester resin, etc. In some embodiments, the third insulating layer 130 may include a photosensitive organic material.

A first anode electrode AE1, a second anode electrode AE2 and a third anode electrode AE3 may be located on the third insulating layer 130 in the display area DA. In addition, a connection electrode CNE and a second pad electrode PD2 of the connection pad PD may be located on the third insulating layer 130 in the non-display area NDA.

The first anode electrode AE1 may overlap the first emission area LA1 and may be at least partially extended to the non-emission area NLA. The second anode electrode AE2 may overlap the second emission area LA2 and may be at least partially extended to the non-emission area NLA, and the third anode electrode AE3 may overlap the third emission area LA3 and may be at least partially extended to the non-emission area NLA. The first anode electrode AE1 may pass (e.g., penetrate) through the third insulating layer 130 and may be connected to the drain electrode DE of the thin-film transistor TL associated with the first anode electrode AE1. The second anode electrode AE2 may pass (e.g., penetrate) through the third insulating layer 130 and may be connected to the drain electrode DE of the thin-film transistor TL associated with the second anode electrode AE2. The third anode electrode AE3 may pass (e.g., penetrate) through the third insulating layer 130 and may be connected to the drain electrode DE of the thin-film transistor TL associated with the third anode electrode AE3.

In some embodiments, the first anode electrode AE1, the second anode electrode AE2, and the third anode electrode AE3 may be reflective electrodes. In such case, the first anode electrode AE1, the second anode electrode AE2, and the third anode electrode AE3 may be one or more metal layers containing a metal such as Ag, Mg, Al, Pt, Pd, Au, Ni, Nd, Ir and/or Cr. In alternative embodiments, the first anode electrode AE1, the second anode electrode AE2, and the third anode electrode AE3 may further include a metal oxide layer stacked on the metal layer. According to example embodiments, the first anode electrode AE1, the second anode electrode AE2, and the third anode electrode AE3 may have a multi-layer structure, e.g., a two-layer structure of ITO/Ag, Ag/ITO, ITO/Mg, or ITO/MgF, or a three-layer structure of ITO/Ag/ITO.

The connection electrode CNE may be electrically connected to the voltage supply line VSL in the non-display area NDA and may be in direct contact with the voltage supply line VSL.

The second pad electrode PD2 may be located on the first pad electrode PD1 in the non-display area NDA. The second pad electrode PD2 may be in direct contact with and electrically connected to the first pad electrode PD1.

In some embodiments, the connection electrode CNE and the second pad electrode PD2 may be made of the same material as the first anode electrode AE1, the second anode electrode AE2, and the third anode electrode AE3, and may be formed together with the first anode electrode AE1, the second anode electrode AE2, and the third anode electrode AE3 via the same fabricating process.

A pixel-defining layer 150 may be located on the first anode electrode AE1, the second anode electrode AE2, and the third anode electrode AE3. The pixel-defining layer 150 may include an opening for exposing the first anode electrode AE1, an opening for exposing the second anode electrode AE2, and an opening for exposing the third anode electrode AE3 and may define the first light-emitting region LA1, the second light-emitting region LA2, the third light-emitting region LA3, and the non-light-emitting region NLA. That is to say, an exposed part of the first anode electrode AE1 which is not covered by the pixel-defining layer 150 may be the first light-emitting area LA1. Similarly, an exposed part of the second anode electrode AE2 which is not covered by the pixel-defining layer 150 may be the second light-emitting area LA2. An exposed part of the third anode electrode AE3 which is not covered by the pixel-defining layer 150 may be the third light-emitting area LA3. The pixel-defining layer 150 may be located in the non-emission area NLA.

In some embodiments, the pixel-defining layer 150 may include an organic insulating material such as polyacrylate resin, epoxy resin, phenolic resin, polyamide resin, polyimide resin, unsaturated polyester resin, poly phenylene ether resin, poly phenylene sulfide resin, and/or benzocyclobutene (BCB).

In some embodiments, the pixel-defining layer 150 may overlap a light-blocking pattern 250 to be described in more detail later. In addition, according to some embodiments, the pixel-defining layer 150 may overlap a bank pattern 370 to be described in more detail later.

As shown in FIGS. 8 and 11, an emission layer OL may be located on the first anode electrode AE1, the second anode electrode AE2, and the third anode electrode AE3.

In some embodiments, the emission layer OL may have the shape of a continuous film formed across the plurality of emission areas LA1, LA2 and LA3 and the non-emission area NLA. Although the emission layer OL is located only in the display area DA in the drawings, embodiments according to the present disclosure are not limited thereto. In some alternative embodiments, a part of the emission layer OL may be further located in the non-display area NDA. The emission layer OL will be described in more detail later.

The cathode electrode CE may be located on the emission layer OL. A part of the cathode electrode CE may be further located in the non-display area NDA. The cathode electrode CE may be electrically connected to the connection electrode CNE in the non-display area NDA and may be in contact with the connection electrode CNE. The voltage supply line VSL may be located in the non-display area NDA. A supply voltage applied to a cathode electrode CE, for example, a voltage ELVSS, may be supplied to the voltage supply line VSL.

In some embodiments, the cathode electrode may be semi-transmissive or transmissive. When the cathode electrode CE is semi-transmissive, it may include Ag, Mg, Cu, Al, Pt, Pd, Au, Ni, Nd, Ir, Cr, Li, Ca, LiF/Ca, LiF/Al, Mo, Ti, or a compound and/or mixture thereof, e.g., a mixture of Ag and Mg. Further, when the thickness of the cathode electrode CE is from several tens to several hundred angstroms, the cathode electrode CE may be semi-transmissive.

When the cathode electrode CE is transmissive, the cathode electrode CE may include a transparent conductive oxide (TCO). For example, the cathode electrode CE may be formed of tungsten oxide (WxOx), titanium oxide (TiO$_2$), indium tin oxide (ITO), indium zinc oxide (IZO), zinc oxide (ZnO), indium tin zinc oxide, MgO (magnesium oxide), etc.

In some embodiments, the cathode electrode CE may completely cover the emission layer OL. In some embodiments, the end of the cathode electrode CE may be located more to the outside (e.g., toward the edge of the first base 110) than the end of the emission layer OL, and the end of the emission layer OL may be completely covered by the cathode electrode CE.

The first anode electrode AE1, the emission layer OL, and the cathode electrode CE may form a first light-emitting element ED1, the second anode electrode AE2, the emission layer OL, and the cathode electrode CE may form a second light-emitting element ED2, and the third anode electrode AE3, the emission layer OL, and the cathode electrode CE may form a third light-emitting element ED3. Each of the first light-emitting element ED1, the second light-emitting element ED2 and the third light-emitting element ED3 may emit exiting light LE.

As shown in FIG. 9, the exiting light LE finally emitted from the emission layer OL may be a mixed light of a first component LE1 and a second component LE2. Each of the first component LE1 and the second component LE2 of the exiting light LE may have a peak wavelength that is equal to or greater than 440 nm and less than 480 nm. That is to say, the exiting light LE may be blue light.

As shown in FIG. 9, according to some embodiments, the emission layer OL may have a structure in which a plurality of emission layers overlap one another, e.g., a tandem structure. For example, the emission layer OL may include a first stack ST1 including the first emission layer EML1, a second stack ST2 located on the first stack ST1 and including the second emission layer EML2, a third stack ST3 located on the second stack ST2 and including the third emission layer EML3, a first charge generation layer CGL1 located between the first stack ST1 and the second stack ST2, and a second charge generation layer CGL2 located between the second stack ST2 and the third stack ST3. The first stack ST1, the second stack ST2, and the third stack ST3 may overlap one another.

The first emission layer EML1, the second emission layer EML2, and the third emission layer EML3 may overlap one another.

In some embodiments, the first emission layer EML1, the second emission layer EML2, and the third emission layer EML3 may all emit light of the third color, e.g., blue light. For example, each of the first emission layer EML1, the second emission layer EML2, and the third emission layer EML3 may be a blue light emission layer and may include an organic material.

In some embodiments, at least one of the first emission layer EML1, the second emission layer EML2, or the third emission layer EML3 may emit a first blue light having a first peak wavelength, and at least another one of the first emission layer EML1, the second emission layer EML2, or the third emission layer EML3 may emit a second blue light having a second peak wavelength different from the first peak wavelength. For example, one selected from the first emission layer EML1, the second emission layer EML2, and the third emission layer EML3 may emit the first blue light having the first peak wavelength, and the other two of the first emission layer EML1, the second emission layer EML2, or the third emission layer EML3 may each emit the second blue light having the second peak wavelength. For example, the exiting light LE finally emitted from the emission layer OL may be mixed light of the first component LE1 and the second component LE2, and the first component LE1 may be the first blue light having the first peak wavelength, and the second component LE2 may be the second blue light having the second peak wavelength.

In some embodiments, the range of one selected from the first peak wavelength and the second peak wavelength may be equal to or greater than 440 nm and less than 460 nm, and the range of the other one selected from the first peak wavelength and the second peak wavelength may be equal to or greater than 460 nm and less than 480 nm. It is, however, to be understood that the ranges of the first peak wavelength and the range of the second peak wavelength are not limited thereto. For example, the range of the first peak wavelength and the range of the second peak wavelength may both (e.g., simultaneously) include 460 nm. In some embodiments, one selected from the first blue light and the second blue light may be light of deep blue color, while the other one selected from the first blue light and the second blue light may be light of sky blue color.

In some embodiments, the exiting light LE emitted from the emission layer OL is blue light and may include a long-wavelength component and a short-wavelength component. Therefore, the emission layer OL may finally emit blue light having an emission peak broadly distributed as the exiting light LE. In this manner, the color visibility may be improved at side viewing angles compared to alternative light-emitting elements that emit blue light having a sharp (e.g., narrower) emission peak.

In some embodiments, each of the first emission layer EML1, the second emission layer EML2, and the third emission layer EML3 may include a host and a dopant. The material of the host is not particularly limited herein as long as it is typically or suitably utilized and may include Alq3 (tris(8-hydroxyquinolino)aluminum), CBP (4,4'-bis(N-carbazolyl)-1,1'-biphenyl), PVK(poly(n-vinylcabazole)), ADN (9,10-di(naphthalene-2-yl)anthracene), TCTA (4,4',4"-Tris (carbazol-9-yl)-triphenylamine), TPBi (1,3,5-tris(N-phenyl-benzimidazole-2-yl)benzene), TBADN (3-tert-butyl-9,10-di (naphth-2-yl)anthracene), DSA (distyrylarylene), CDBP (4,4'-bis(9-carbazolyl)-2,2"-dimethyl-biphenyl), MADN (2-Methyl-9,10-bis(naphthalen-2-yl)anthracene), etc.

Each of the first emission layer EML1, the second emission layer EML2, and the third emission layer EML3 that emits blue light may include a fluorescent material including one selected from the group consisting of: spiro-DPVBi, spiro-6P, DSB (distyryl-benzene), DSA (distyryl-arylene), PFO (polyfluorene) polymer, and PPV (poly(p-phenylene vinylene)) polymer. As another example, each of the first emission layer EML1, the second emission layer EML2, and the third emission layer EML3 may include a phosphorescent material including an organometallic complex such as (4,6-F2ppy)2Irpic.

As described above, at least one of the first emission layer EML1, the second emission layer EML2, or the third emission layer EML3 may emit blue light in a different wavelength range from that of at least another one selected from the first emission layer EML1, the second emission layer EML2, and the third emission layer EML3. In order to emit blue light in different wavelength ranges, the first emission layer EML1, the second emission layer EML2 and the third emission layer EML3 may include the same material and the resonance distance may be adjusted. In some embodiments, in order to emit blue light in different wavelength ranges, at least one of the first emission layer EML1, the second emission layer EML2, or the third emission layer EML3 may include a different material from another one of them.

It is, however, to be understood that the present disclosure is not limited thereto. The blue light emitted by each of the first emission layer EML1, the second emission layer EML2, and the third emission layer EML3 may all have a peak wavelength of 440 nm to 480 nm, and may be made of the same material.

Alternatively, in other alternative embodiments, a first one selected from the first emission layer EML1, the second emission layer EML2, and the third emission layer EML3 may emit the first blue light having the first peak wavelength, a second one selected from the first emission layer EML1, the second emission layer EML2, and the third emission layer EML3 may emit the second blue light having the second peak wavelength different from the first peak wavelength, and a third one selected from the first emission layer EML1, the second emission layer EML2, and the third emission layer EML3 may emit the third blue light having a third peak wavelength different from the first peak wavelength and the second peak wavelength. In other alternative embodiments, the range of a first one selected from the first peak wavelength, the second peak wavelength, and the third peak wavelength may be equal to or greater than 440 nm and less than 460 nm. The range of a second one selected from the first peak wavelength, the second peak wavelength, and the third peak wavelength may be equal to or greater than 460 nm and less than 470 nm. The range of a third one selected from the first peak wavelength, the second peak wavelength, and the third peak wavelength may be equal to or greater than 470 nm and less than 480 nm.

According to other alternative embodiments, the exiting light LE emitted from the emission layer OL is blue light and may include a long-wavelength component, a medium-wavelength component, and a short-wavelength component. Therefore, the emission layer OL may finally emit blue light having an emission peak broadly distributed as the exiting light LE, and the color visibility at the side viewing angles may be improved.

In the display devices according to the embodiments described above, in contrast to light-emitting elements that do not employ the tandem structure, because of the structure in which a number of light-emitting elements may be stacked on one another, the luminous efficiency may be relatively increased and the lifetime (e.g., lifespan) of the display device may also be relatively improved.

Alternatively, according to some alternative embodiments, at least one of the first emission layer EML1, the second emission layer EML2, or the third emission layer EML3 may emit light of the third color, e.g., blue light, and at least another one of the first emission layer EML1, the second emission layer EML2, or the third emission layer EML3 may emit light of the second color, e.g., green light. In some other embodiments, the range of peak wavelength of blue light emitted by at least one of the first emission layer EML1, the second emission layer EML2, or the third emission layer EML3 may be from 440 nm to 480 nm, or from 460 nm to 480 nm. The green light emitted by at least another one of the first emission material layer EML1, the second emission material layer EML2, or the third emission material layer EML3 may have a peak wavelength in the range of 510 nm to 550 nm.

For example, one selected from the first emission layer EML1, the second emission layer EML2, and the third emission layer EML3 may be a green light emission layer emitting green light, while the other two selected from the first emission layer EML1, the second emission layer EML2, and the third emission layer EML3 may be blue light emission layers emitting blue light. When the other two selected from the first emission material layer EML1, the second emission layer EML2, and the third emission layer EML3 are blue light emission layers, the range of the peak wavelength of the blue light emitted by the two blue light emission layers may be equal to each other or different from each other.

In some embodiments, the exiting light LE emitted from the emission layer OL may be a mixed light of the first component LE1 which is blue light and the second component LE2 which is green light. For example, when the first component LE1 is deep blue light and the second component LE2 is green light, the exiting light LE may be light of a sky blue color. Similarly to the above-described embodiments, the exiting light LE emitted from the emission layer OL may be a mixed light of blue light and green light, and includes a long-wavelength component and a short-wavelength component. Therefore, the emission layer OL may finally emit blue light having an emission peak broadly distributed as the exiting light LE, and the color visibility at the side viewing angles may be improved. In addition, because the second component LE2 of the exiting light LE is green light, green light component of the light provided from the display device 1 to the outside may be supplemented, and accordingly the color reproducibility of the display device 1 may be improved.

In some embodiments, the green light emission layer selected from at least one among the first emission layer EML1, the second emission layer EML2 and the third emission layer EML3 may include a host and a dopant. The material of the host included in the green light emission layer is not particularly limited herein as long as it is typically utilized and may include Alq3 (tris(8-hydroxyquinolino)aluminum), CBP(4,4'-bis(N-carbazolyl)-1,1'-biphenyl), PVK (poly(n-vinylcabazole)), ADN (9,10-di(naphthalene-2-yl)anthracene), TCTA (4,4',4"-Tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2"-dimethyl-biphenyl), MADN (2-Methyl-9,10-bis(naphthalen-2-yl)anthracene), etc.

The dopant included in the green light emission layer may include, for example, a fluorescent material such as Alq3 (tris-(8-hydroyquinolato)aluminum(III)), and/or a phosphorescent material such as Ir(ppy)3 (fac tris(2-phenylpyridine) iridium), Ir(ppy)2(acac) (Bis(2-phenylpyridine)(acetylacetonate)iridium(III)) and/or Ir(mpyp)3(2-phenyl-4-methyl-pyridine iridium).

The first charge generation layer CGL1 may be located between the first stack ST1 and the second stack ST2. The first charge generation layer CGL1 may serve to inject charges into each of the emission layers. The first charge generation layer CGL1 may control charge balance between the first stack ST1 and the second stack ST2. The first charge generation layer CGL1 may include an n-type charge (e.g., N-charge) generation layer CGL11 and a p-type charge (e.g., P-charge) generation layer CGL12. The p-type charge generation layer CGL12 may be located on the n-type charge generation layer CGL11 and may be between the n-type charge generation layer CGL11 and the second stack ST2.

The first charge generation layer CGL1 may have a junction structure in which the n-type charge generation layer CGL11 and the p-type charge generation layer CGL12 are bonded with each other. The n-type charge generation layer CGL11 is located closer to the anode electrodes AE1, AE2, and AE3 than to the cathode electrode CE. The p-type charge generation layer CGL12 is located closer to the cathode electrode CE than to the anode electrodes AE1, AE2, and AE3. The n-type charge generation layer CGL11 supplies electrons to the first emission layer EML1 adjacent to the anode electrodes AE1, AE2, and AE3, and the p-type charge generation layer CGL12 supplies holes to the second emission layer EML2 included in the second stack ST2. By locating the first charge generation layer CGL1 between the first stack ST1 and the second stack ST2, charges are supplied to each of the emission layers to increase the luminous efficiency and to lower the supply voltage.

The first stack ST1 may be located on the first anode electrode AE1, the second anode electrode AE2, and the third anode electrode AE3, and may further include a first hole transport layer HTL1, a first electron block layer BIL1, and a first electron transport layer ETL1.

The first hole transport layer HTL1 may be located on the first anode electrode AE1, the second anode electrode AE2, and the third anode electrode AE3. The first hole transport layer HTL1 may facilitate the transport of holes and may include a hole transport material. The hole transport material may include, but is not limited to, one or more carbazole derivatives such as N-phenylcarbazole and/or polyvinylcarbazole, fluorene derivatives, triphenylamine derivatives such as TPD(N,N'-bis(3-methylphenyl)-N,N'-diphenyl-[1,1-biphenyl]-4,4'-diamine) and/or TCTA(4,4',4"-tris(N-carbazolyl)triphenylamine), NPB(N,N'-di(1-naphthyl)-N,N'-diphenylbenzidine), TAPC(4,4'-Cyclohexylidene bis[N,N-bis(4-methylphenyl)benzenamine]), etc.

The first electron block layer BIL1 may be located on the first hole transport layer HTL1, and may be located between the first hole transport layer HTL1 and the first emission layer EML1. The first electron block layer BIL1 may include the hole transport material and a metal and/or a metal compound to prevent or substantially prevent the electrons generated in the first emission layer EML1 from flowing into the first hole transport layer HTL1. In some embodiments, the first hole transport layer HTL1 and the first electron block layer BIL1 described above may each be a single layer where the materials are mixed.

The first electron transport layer ETL1 may be located on the first emission layer EML1, and may be located between the first charge generation layer CGL1 and the first emission layer EML1. In some embodiments, the first electron transport layer ETL1 may include an electron transparent material such as Alq3 (Tris(8-hydroxyquinolinato)aluminum), TPBi (1,3,5-Tri(1-phenyl-1H-benzo[d]imidazol yl)phenyl), BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,08)-(1,1'-Biphenyl-4-olato)aluminum), Bebq2 (berylliumbis(benzoquinolin-10-olate), ADN (9,10-di(naphthalene-2-yl)anthracene), or a mixture thereof. It is, however, to be noted that the type of the electron transport material is not particularly limited to the examples listed above. The second stack ST2 may be located on the first charge generation layer CGL1 and may further include a second hole transport layer HTL2, a second electron block layer BIL2, and a second electron transport layer ETL2.

The second hole transport layer HTL2 may be located on the first charge generation layer CGL1. The second hole transport layer HTL2 may be made of the same material as the first hole transport layer HTL1 or may include one or more materials selected from the materials listed above as materials included in the first hole transport layer HTL1. The second hole transport layer HTL2 may be made of a single layer or multiple layers.

The second electron block layer BIL2 may be located on the second hole transport layer HTL2 and may be located between the second hole transport layer HTL2 and the second emission layer EML2. The second electron block layer BIL2 may be made of the same material and the same structure as the first electron block layer BIL1 or may include one or more materials selected from the materials listed above as the materials included in the first electron block layer BIL1.

The second electron transport layer ETL2 may be located on the second emission layer EML2, and may be located between the second charge generation layer CGL2 and the second emission layer EML2. The second electron transport layer ETL2 may be made of the same material and the same structure as the first electron transport layer ETL1 or may include one or more materials selected from the materials listed above as the materials included in the first electron transport layer ETL1. The second electron transport layer ETL2 may be made of a single layer or multiple layers.

The second charge generation layer CGL2 may be located on the second stack ST2 and may be located between the second stack ST2 and the third stack ST3.

The second charge generation layer CGL2 may have the same structure as the first charge generation layer CGL1 described above. For example, the second charge generation layer CGL2 may include an n-type charge generation layer CGL21 located closer to the second stack ST2 and a p-type charge generation layer CGL22 located closer to the cathode electrode CE. The p-type charge generation layer CGL22 may be located on the n-type charge generation layer CGL21.

The second charge generation layer CGL2 may have a junction structure in which the n-type charge generation layer CGL21 and the p-type charge generation layer CGL22 are bonded with each other. The first charge generation layer CGL1 and the second charge generation layer CGL2 may be made of different materials or may be made of the same material.

The second stack ST2 may be located on the second charge generation layer CGL2 and may further include a third hole transport layer HTL3 and a third electron transport layer ETL3.

The third hole transport layer HTL3 may be located on the second charge generation layer CGL2. The third hole transport layer HTL3 may be made of the same material as the first hole transport layer HTL1 or may include one or more materials selected from the materials listed above as the materials included in the first hole transport layer HTL1. The third hole transport layer HTL3 may be made of a single layer or multiple layers. When the third hole transport layer HTL3 is made of multiple layers, the layers may include different materials.

The third electron transport layer ETL3 may be located on the third emission layer EML3, and may be located between the cathode electrode CE and the third emission layer EML3. The third electron transport layer ETL3 may be made of the same material and the same structure as the first electron transport layer ETL1 or may include one or more materials selected from the materials listed above as the materials included in the first electron transport layer ETL1. The third electron transport layer ETL3 may be made of a single layer or multiple layers. When the third electron transport layer ETL3 is made of multiple layers, the layers may include different materials.

In some embodiments, a hole injection layer may be further located between the first stack ST1 and the first anode electrode AE1, the second anode electrode AE2, and the third anode electrode AE3, between the second stack ST2 and the first charge generation layer CGL1, and/or between the third stack ST3 and the second charge generation layer CGL2. The hole injection layer may facilitate injection of holes into the first emission layer EML1, the second emission layer EML2 and the third emission layer EML3. In some embodiments, the hole injection layer may be made of, but the present disclosure is not limited to, at least one selected from the group consisting of: CuPc (copper phthalocyanine), PEDOT (poly(3,4)-ethylenedioxythiophene), PANI (polyaniline), and NPD (N,N-dinaphthyl-N,N'-diphenyl benzidine). In some embodiments, the hole injection layer may be located between the first stack ST1 and the first anode electrode AE1, the second anode electrode AE2, and the third anode electrode AE3, between the second stack ST2 and the first charge generation layer CGL1, and between the third stack ST3 and the second charge generation layer CGL2.

In some embodiments, an electron injection layer may be further located between the third electron transport layer ETL3 and the cathode electrode CE, between the second charge generation layer CGL2 and the second stack ST2, and/or between the first charge generation layer CGL1 and the first stack ST1. The electron injection layer facilitates the injection of electrons and may be made of, but the present disclosure is not limited to, Alq3 (tris(8-hydroxyquinolino) aluminum), PBD, TAZ, spiro-PBD, BAlq, and/or SAlq. In addition, the electron injection layer may be a metal halide compound and may be, but the present disclosure is not limited to, at least one selected from the group consisting of: MgF2, LiF, NaF, KF, RbF, CsF, FrF, Lil, Nal, KI, Rbl, Csl, Frl and CaF2. In addition, the electron injection layer may include a lanthanide-based material such as Yb, Sm, and/or Eu. In some embodiments, the electron injection layer may include a metal halide material as well as a lanthanide material such as Rbl:Yb and/or KI:Yb. When the electron injection layer includes both (e.g., simultaneously) a metal halide material and a lanthanide material, the electron injection layer may be formed by co-deposition of the metal halide material and the lanthanide material. In some embodiments, the electron injection layer may be located between the third electron transport layer ETL3 and the cathode electrode CE, between the second charge generation layer CGL2 and the second stack ST2, and between the first charge generation layer CGL1 and the first stack ST1.

In addition to the above-described structure, the structure of the emission layer OL may be suitably altered. For example, the emission layer OL may be modified as an emission layer OLa shown in FIG. 10. Unlike the structure shown in FIG. 9, the emission layer OLa shown in FIG. 10 may further include a fourth stack ST4 located between the third stack ST3 and the second stack ST2, and may further include a third charge generation layer CGL3 located between the third stack ST3 and the second stack ST2.

The fourth stack ST4 may include a fourth emission layer EML4 and may further include a fourth hole transport layer HTL4, a third electron block layer BIL4, and a fourth electron transport layer ETL4.

The first emission layer EML1, the second emission layer EML2, the third emission layer EML3, and the fourth emission layer EML4 that are included in the emission layer OLa may all emit light of the third color, e.g., blue light. At least one of the first emission layer EML1, the second emission layer EML2, the third emission layer EML3, or the fourth emission layer EML4 may emit blue light in a different wavelength range from that of at least another one of the first emission layer EML1, the second emission layer EML2, the third emission layer EML3, and the fourth emission layer EML4.

In some embodiments, at least one of the first emission layer EML1, the second emission layer EML2, the third emission layer EML3, or the fourth emission layer EML4 may emit green light, and at least another one of the first emission layer EML1, the second emission layer EML2, the third emission layer EML3, and the fourth emission layer EML4 may emit blue light. For example, one of the first emission layer EML1, the second emission layer EML2, the third emission layer EML3, and the fourth emission layer EML4 may be a green light emission layer, while the other three of the first emission layer EML1, the second emission layer EML2, the third emission layer EML3, and the fourth emission layer EML4 may be blue light emission layers.

The fourth hole transport layer HTL4 may be located on the second charge generation layer CGL2. The fourth hole transport layer HTL4 may be made of the same material as the first hole transport layer HTL1 or may include one or more materials selected from the materials listed above as materials included in the first hole transport layer HTL1. The fourth hole transport layer HTL4 may be made of a single layer or multiple layers. When the fourth hole transport layer HTL4 is made of multiple layers, the layers may include different materials.

The third electron block layer BIL4 may be located on the fourth hole transport layer HTL4 and may be located between the fourth hole transport layer HTL4 and the fourth emission layer EML4. The third electron block layer BIL4 may be made of the same material and the same structure as the first electron block layer BIL1 or may include one or more materials selected from the materials listed above as the materials included in the first electron block layer BIL1. In some alternative embodiments, the third electron block layer BIL4 may be omitted.

The fourth electron transport layer ELT4 may be located on the fourth emission layer EML4 and may be located between the third charge generation layer CGL3 and the fourth emission layer EML4. The fourth electron transport layer ETL4 may be made of the same material and the same structure as the first electron transport layer ETL1 or may include one or more materials selected from the materials listed above as the materials included in the first electron transport layer ETL1. The fourth electron transport layer ETL4 may be made of a single layer or multiple layers. When the fourth electron transport layer ETL4 is made of multiple layers, the layers may include different materials.

The third charge generation layer CGL3 may have the same structure as the first charge generation layer CGL1 described above. For example, the third charge generation layer CGL3 may include an n-type charge generation layer CGL31 located closer to the second stack ST2 and a p-type charge generation layer CGL32 located closer to the cathode electrode CE. The p-type charge generation layer CGL32 may be located on the n-type charge generation layer CGL31.

In some embodiments, an electron injection layer may be further located between the fourth stack ST4 and the third charge generation layer CGL3. In addition, a hole injection layer may be further located between the fourth stack ST4 and the second charge generation layer CGL2.

In some embodiments, both the emission layer OL shown in FIG. 9 and the emission layer OLa shown in FIG. 10 may not include (e.g., may exclude) a red light emission layer and thus may not emit the light of the first color, e.g., red light. That is to say, the exiting light LE may not include (e.g., may exclude) an optical component having a peak wavelength in the range of approximately 610 nm to 650 nm, and the exiting light LE may include only an optical component having a peak wavelength of 440 nm to 550 nm.

In some embodiments, as described above, the light-emitting elements ED1, ED2, and ED3 may be configured as a single emission layer without including multiple light-emitting layers EML1, EML2, and EML3 that include organic materials. The single emission layer may include an inorganic light-emitting layer including quantum dots (QD), a micro LED, or a nano LED.

As shown in FIG. 11, a dam member DM may be located on the second insulating layer 117 in the non-display area NDA.

The dam member DM may be located more to the outside (e.g., the edge of the first base 110) than the voltage supply line VSL. In other words, as shown in FIG. 11, the voltage supply line VSL may be located between the dam member DM and the display area DA.

In some embodiments, the dam member DM may include a plurality of dams. For example, the dam member DM may include a plurality of dams. For example, the dam member DM may include a first dam D1 and a second dam D2.

The first dam D1 may partially overlap the voltage supply line VSL and may be spaced apart from the third insulating layer 130 with the voltage supply line VSL interposed therebetween. In some embodiments, the first dam D1 may include a first lower dam pattern D11 located on the second insulating layer 117 and a first upper dam pattern D12 located on the first lower dam pattern D11.

The second dam D2 may be located on the outer side of the first dam D1 (e.g., the second dam D2 is closer to the edge of the first base 110 than the first dam D1 is to the edge of the first base 110) and may be spaced apart from the first dam D1. In some embodiments, the second dam D2 may include a second lower dam pattern D21 located on the second insulating layer 117 and a second upper dam pattern D22 located on the second lower dam pattern D21.

In some embodiments, the first lower dam pattern D11 and the second lower dam pattern D21 may be made of the same material as the third insulating layer 130 and may be formed together with the third insulating layer 130.

In some embodiments, the first upper dam pattern D12 and the second upper dam pattern D22 may be made of the same material as the pixel-defining layer 150 and may be formed together with the pixel-defining layer 150.

In some embodiments, the height of the first dam D1 may be different from the height of the second dam D2. For example, the height of the second dam D2 may be greater than the height of the first dam D1. That is, the height of the dams included in the dam member DM may gradually increase away from the display area DA. Accordingly, it may be possible to more effectively block an organic matter from overflowing during a process of forming an organic layer 173 included by an encapsulation layer 170, which will be described later.

As shown in FIGS. 8 and 11, a first capping layer 160 may be located on the cathode electrode CE. The first capping layer 160 may be commonly located across the first emission area LA1, the second emission area LA2, the third emission area LA3, and the non-emission area NLA, so that viewing angle characteristics may be improved and the out-coupling efficiency may be increased.

The first capping layer 160 may include an inorganic material and/or an organic material having suitable light-transmitting properties. In other words, the first capping layer 160 may be formed as an inorganic layer, as an organic layer, or as an organic layer containing inorganic particles. For example, the first capping layer 160 may include a triamine derivative, a carbazole biphenyl derivative, an arylene diamine derivative, and/or an aluminum quinolinolate complex (Alq3).

In some embodiments, the first capping layer 160 may be made of a mixture of a high-refractive material and a low-refractive material. In some embodiments, the first capping layer 160 may include two layers having different refractive indices, for example, a high refractive index layer and a low refractive index layer.

In some embodiments, the first capping layer 160 may completely cover the cathode electrode CE. In some embodiments, as shown in FIGS. 11, the end of the first capping layer 160 may be located more to the outside (e.g., the end of the first capping layer 160 is closer to the edge of the first base 110) than the end of the cathode electrode CE may be, and the end of the cathode electrode CE may be completely covered by the first capping layer 160.

The encapsulation layer 170 may be located on the first capping layer 160. The encapsulation layer 170 protects elements located under the encapsulation layer 170, for example, the light-emitting elements ED1, ED2 and ED3, from external foreign substances such as moisture. The encapsulation layer 170 is commonly located across the first emission area LA1, the second emission area LA2, the third emission area LA3, and the non-emission area NLA. In some embodiments, the encapsulation layer 170 may directly cover the cathode electrode CE (e.g., without the first capping layer 160). In some embodiments, a capping layer (e.g., the first capping layer 160) covering the cathode electrode CE may be further located between the encapsulation layer 170 and the cathode electrode CE, in which case the encapsulation layer 170 may directly cover the capping layer. The encapsulation layer 170 may be a thin-film encapsulation layer.

In some embodiments, the encapsulation layer 170 may include a lower inorganic layer 171, an organic layer 173, and an upper inorganic layer 175 which are sequentially stacked on the first capping layer 160.

In some embodiments, the lower inorganic layer 171 may cover the first light-emitting element ED1, the second light-emitting element ED2, and the third light-emitting element ED3 in the display area DA. The lower inorganic layer 171 may cover the dam member DM in the non-display area NDA and may be extended to the outside of (e.g., beyond) the dam member DM.

In some embodiments, the lower inorganic layer 171 may completely cover the first capping layer 160. In some embodiments, the end of the lower inorganic layer 171 may be located more to the outside (e.g., toward the edge of the first base 110) than the end of the first capping layer 160, and the end of the first capping layer 160 may be completely covered by the lower inorganic layer 171.

The lower inorganic layer 171 may include a plurality of stacked layers. A more detailed structure of the lower inorganic layer 171 will be described below.

The organic layer 173 may be located on the lower inorganic layer 171. The organic layer 173 may cover the first light-emitting element ED1, the second light-emitting element ED2, and the third light-emitting element ED3 in the display area DA. In some embodiments, a part of the organic layer 173 may be located in the non-display area NDA but may not be located outside the dam member DM. Although a part of the organic layer 173 is located more to the inside than the first dam D1 in the drawing, the present disclosure is not limited thereto. In some alternative embodiments, a part of the organic layer 173 may be accommodated in a space between the first dam D1 and the second dam D2, and the end of the organic layer 173 may be located between the first dam D1 and the second dam D2.

The upper inorganic layer 175 may be located on the organic layer 173. The upper inorganic layer 175 may cover the organic layer 173. In some embodiments, the upper inorganic layer 175 may be in direct contact with the lower inorganic layer 171 in the non-display area NDA to form an inorganic/inorganic junction. In some embodiments, the end of the upper inorganic layer 175 and the end of the lower inorganic layer 171 may be substantially aligned with each other. The upper inorganic layer 175 may include a plurality of stacked layers. A detailed structure of the upper inorganic layer 175 will be described below.

Each of the lower inorganic layer 171 and the upper inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and/or the like.

In some embodiments, the organic layer 173 may be made of acrylic resin, methacrylic resin, polyisoprene, vinyl resin, epoxy resin, urethane resin, cellulose resin and/or perylene resin.

Hereinafter, the color conversion substrate 30 will be described with further reference to FIGS. 12 to 15 in conjunction to FIGS. 1 to 11.

Figure 12:
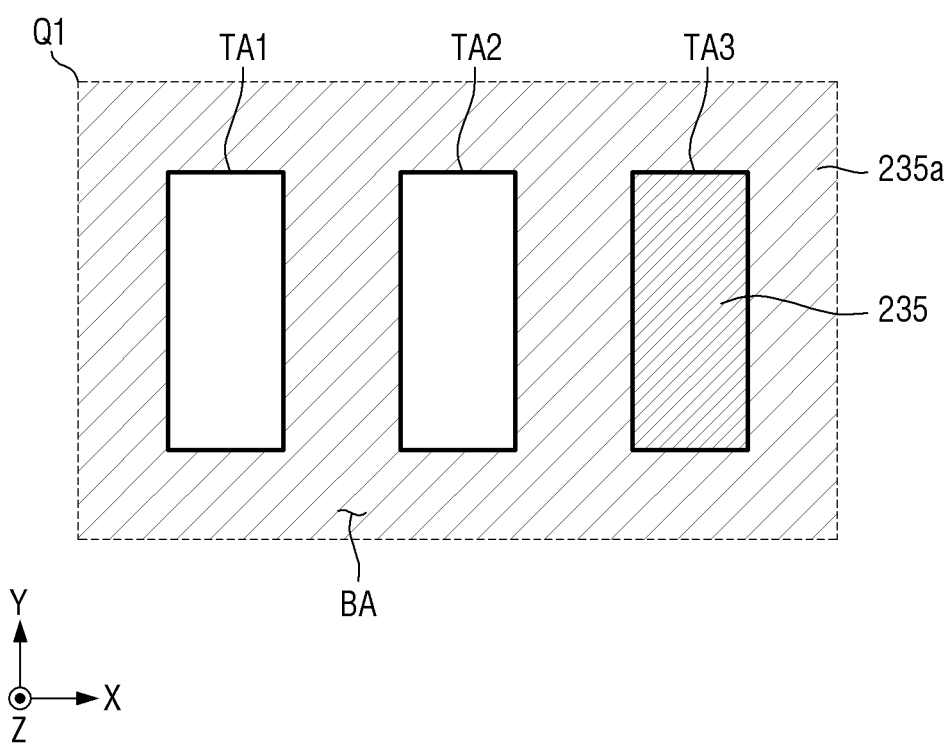
FIG. 12 is a plan view showing a layout of a third color filter on a color conversion substrate of a display device according to some embodiments of the present disclosure.
Figure 13:
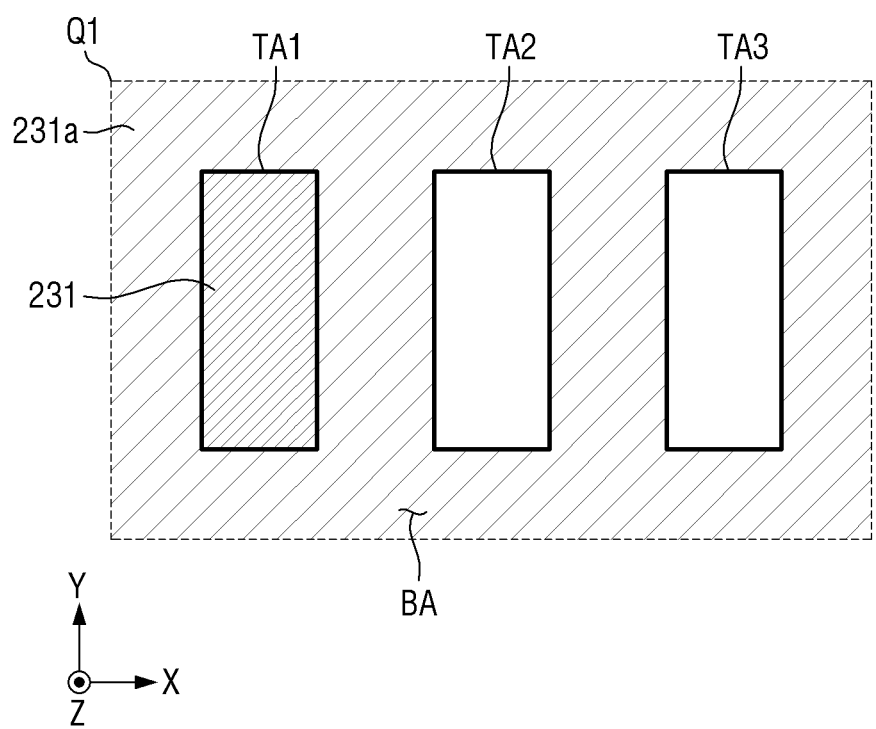
FIG. 13 is a plan view showing a layout of a first color filter on a color conversion substrate of a display device according to some embodiments of the present disclosure.
Figure 14:
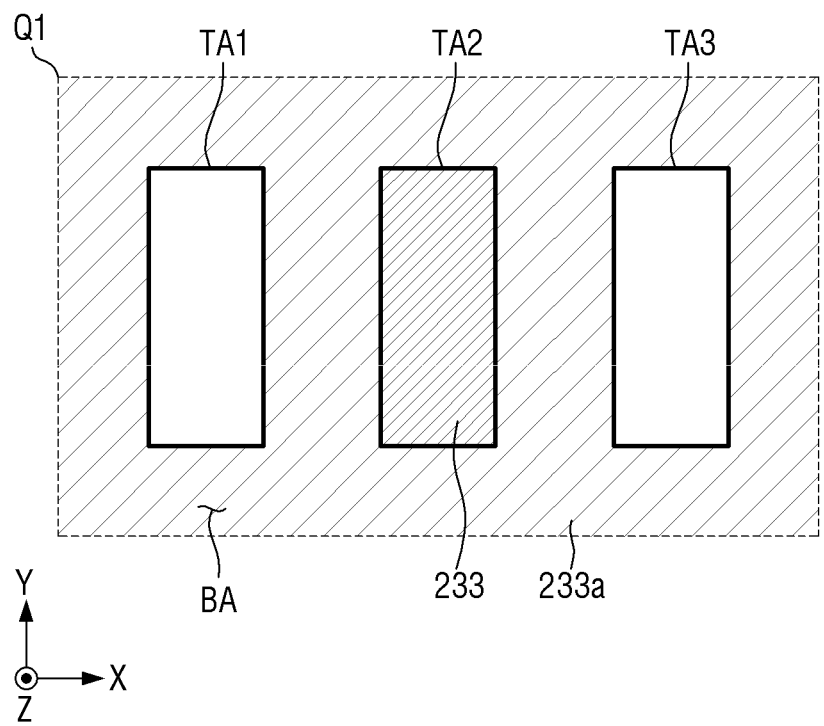
FIG. 14 is a plan view showing a layout of a second color filter on a color conversion substrate of a display device according to some embodiments of the present disclosure.
Figure 15:
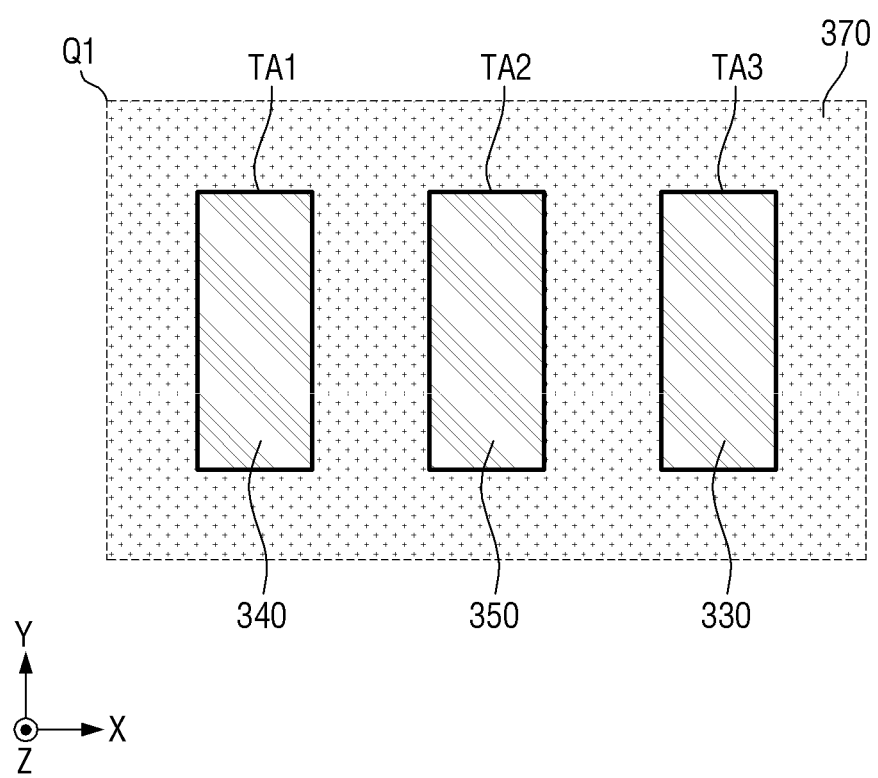
FIG. 15 is a plan view showing a layout of a bank pattern, a first wavelength conversion pattern, a second wavelength conversion pattern, and a light-transmitting pattern on a color conversion substrate of a display device according to some embodiments of the present disclosure.

FIG. 12 is a plan view showing a layout of a third color filter on a color conversion substrate of a display device according to some embodiments of the present disclosure. FIG. 13 is a plan view showing a layout of a first color filter on a color conversion substrate of a display device according to some embodiments of the present disclosure. FIG. 14 is a plan view showing a layout of a second color filter on a color conversion substrate of a display device according to some embodiments of the present disclosure. FIG. 15 is a plan view showing a layout of a bank pattern, a first wavelength conversion pattern, a second wavelength conversion pattern, and a light-transmitting pattern on a color conversion substrate of a display device according to some embodiments of the present disclosure.

A second base 310 shown in FIGS. 8 and 11 may be made of a light-transmitting material.

In some embodiments, the second base 310 may include a glass substrate and/or a plastic substrate. In some embodiments, the second base 310 may further include a separate layer located on the glass substrate and/or the plastic substrate, e.g., an insulating layer such as an inorganic film.

In some embodiments, a plurality of light-transmitting areas TA1, TA2 and TA3 and a light-blocking area BA may be defined on the second base 310. When the second base 310 includes a glass substrate, the refractive index of the second base may be approximately 1.5.

As shown in FIGS. 8 and 11, a color filter layer may be disposed on a surface of the second base 310 facing the display substrate 10. The color filter layer may include color filters 231, 233, and 235 and a light-blocking pattern 250.

As shown in FIGS. 8, 11, and 12 to 14, the color filters 231, 233, and 235 may overlap the light-transmitting areas TA1, TA2, and TA3, respectively. The light-blocking pattern 250 may be disposed to overlap the light-blocking area BA. That is to say, in the present embodiment, the light-blocking area BA may be defined as an area in which the light-blocking pattern 250 is disposed. The first color filter 231 may overlap a first light-transmitting area TA1, the second color filter 233 may overlap a second light-transmitting area TA2, and the third color filter 235 may overlap a third light-transmitting area TA3. The light-blocking pattern 250 may be disposed to overlap the light-blocking area BA to block transmission of light. In some embodiments, the light-blocking pattern 250 may be arranged in a substantially lattice formation when viewed from the top (e.g., in a plan view). According to an embodiment, the light-blocking pattern 250 may include a first light-blocking pattern portion 235a on a surface of the second base 310, a second light-blocking pattern portion 231a on the first light-blocking pattern portion 235a, and a third light-blocking pattern portion 233a on the second light-blocking pattern portion 231a. The first light-blocking pattern portion 235a may include the same material as the third color filter 235, and the second light-blocking pattern portion 231a may include the same material as the first color filter 231, and the third light-blocking pattern portion 233a may include the same material as the second color filter 233. That is to say, the light-blocking pattern 250 may include a structure in which the first light-blocking pattern portion 235a, the second light-blocking pattern portion 231a, and the third light-blocking pattern portion 233a are sequentially stacked on one surface of the second base 310 in the light-blocking area BA. In some embodiments, the light-blocking pattern 250 may include an organic light-blocking material, and may be formed via processes of coating and exposing the organic light-blocking material. For example, the organic light-blocking material may include a black matrix.

The first color filter 231 may work as a blocking filter that blocks blue light and green light. In some embodiments, the first color filter 231 may selectively transmit the light of the first color (e.g., red light) while blocking or absorbing the light of the second color (e.g., green light) and the light of the third color (e.g., blue light). For example, the first color filter 231 may be a red color filter and may include a red colorant. The first color filter 231 may include a base resin and a red colorant dispersed in the base resin. As will be described in more detail below, the first color filter 231 may include at least two layers. The at least two layers may include a first layer and a second layer between the first layer and the second base 310.

The second color filter 233 may work as a blocking filter that blocks blue light and red light. In some embodiments, the second color filter 233 may selectively transmit the light of the second color (e.g., green light) while blocking or absorbing the light of the third color (e.g., blue light) and the light of the first color (e.g., red light). For example, the second color filter 233 may be a green color filter and may include a green colorant.

The third color filter 235 may selectively transmit the light of the third color (e.g., blue light) while blocking or absorbing the light of the first color (e.g., red light) and the light of the second color (e.g., green light). In some embodiments, the third color filter 235 may be a blue color filter and may include a blue colorant such as a blue dye and/or a blue pigment. As used herein, a colorant encompasses a dye as well as a pigment.

As shown in FIGS. 8 and 11, a low refractive index layer 391 covering the light-blocking pattern 250, the first color filter 231, the second color filter 233, and the third color filter 235 may be located on a surface of the second base 310. In some embodiments, the low refractive index layer 391 may be in direct contact with the first color filter 231, the second color filter 233, and the third color filter 235. In addition, according to some embodiments, the low refractive index layer 391 may also be in direct contact with the light-blocking pattern 250.

The low refractive index layer 391 may have a lower refractive index than a wavelength conversion patterns 340 and 350 and a light-transmitting pattern 330. For example, the low refractive index layer 391 may be made of an inorganic material. For example, the low refractive index layer 391 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc. In some embodiments, the low refractive index layer 391 may include a plurality of hollow particles to lower the refractive index.

A low refractive index capping layer 392 may be further disposed between the low refractive index layer 391 and the wavelength conversion patterns 340 and 350 and between the low refractive index layer 391 and the light-transmitting pattern 330. In some embodiments, the low refractive index capping layer 392 may be in direct contact with the wavelength conversion patterns 340 and 350 and the light-transmitting pattern 330. In addition, according to some embodiments, the low refractive index capping layer 392 may also be in direct contact with the bank pattern 370.

The low refractive index capping layer 392 may have a lower refractive index than the wavelength conversion patterns 340 and 350 and the light-transmitting pattern 330. For example, the low refractive index capping layer 392 may be made of an inorganic material. For example, the low refractive index capping layer 392 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc. In some embodiments, the low refractive index capping layer 392 may include a plurality of hollow particles to lower the refractive index.

The low refractive index capping layer 392 may prevent or reduce instances of the first color filter 231, the second color filter 233, and the third color filter 235 being damaged and/or contaminated by impurities such as moisture and/or air introduced from the outside. In addition, the low refractive index capping layer 392 may prevent or reduce instances of the colorant contained in the first color filter 231, the second color filter 233, and the third color filter 235 diffusing into other elements, e.g., a first wavelength conversion pattern 340 and a second wavelength conversion pattern 350, etc.

In some embodiments, the low refractive index layer 391 and the low refractive index capping layer 392 may cover side surfaces of the light-blocking pattern 250 in the non-display area NDA. In addition, according to some embodiments, the low refractive index capping layer 392 may be in direct contact with the second base 310 in the non-display area NDA.

The bank pattern 370 may be located on a surface of the low refractive index capping layer 392 facing the display substrate 10. In some embodiments, the bank pattern 370 may be located directly on the surface of the low refractive index capping layer 392 and may be in direct contact with the low refractive index capping layer 392.

In some embodiments, the bank pattern 370 may be disposed to overlap the non-emission area NLA or the light-blocking area BA. For example, the light-blocking area BA may completely cover the bank pattern 370, and the light-blocking pattern 250 located in the light-blocking area BA may completely cover the bank pattern 370. The light-blocking pattern 250 may have an area greater than that of the bank pattern 370 when viewed from the top (e.g., in a plan view), and the area of each of the color filters 231, 233, and 235 may be smaller than the area of the wavelength conversion patterns 340 and 350 and the light-transmitting pattern 330.

In some embodiments, as shown in FIG. 15, the bank pattern 370 may be around (e.g., surround) the first light-transmitting area TA1, the second light-transmitting area TA2, and the third light-transmitting area TA3 when viewed from the top (e.g., in a plan view). The bank pattern 370 may define the space where each of the first wavelength conversion pattern 340, the second wavelength conversion pattern 350, and a light-transmitting pattern 330 is formed.

In some embodiments, the bank pattern 370 may be implemented as a single pattern which is a single piece, as shown in FIG. 15, but the present disclosure is not limited thereto. In an alternative embodiment, a part of the bank pattern 370 around (e.g., surrounding) the first light-transmitting area TA1, a part of the bank pattern 370 around (e.g., surrounding) the second light-transmitting area TA2, and a part of the bank pattern 370 around (e.g., surrounding) the third light-transmitting area TA3 may be formed as individual patterns separate from one another.

When the first wavelength conversion pattern 340, the second wavelength conversion pattern 350, and the light-transmitting pattern 330 are formed by a method of ejecting an ink composition utilizing a nozzle, that is, an inkjet printing method, the bank pattern 370 may serve as a guide that stably positions the ejected ink composition at a desired or suitable position. That is, the bank pattern 370 may function as a barrier rib.

In some embodiments, the bank pattern 370 may overlap the pixel-defining layer 150.

As shown in FIG. 11, in some embodiments, the bank pattern 370 may be further located in the non-display area NDA. The bank pattern 370 may overlap the light-blocking pattern 250 in the non-display area NDA.

In some embodiments, the bank pattern 370 may include an organic material having photo-curability. In addition, according to some embodiments, the bank pattern 370 may include an organic material having photo-curability and including a light-blocking material. In the case where the bank pattern 370 has light-blocking properties, the bank pattern 370 may prevent or substantially prevent light from intruding (e.g., mixing) between neighboring emission areas in the display area DA. For example, the bank pattern 370 may block the exiting light LE emitted from the second light emitting element ED2 from entering the first wavelength conversion pattern 340 overlapping the first emission area LA1. In addition, the bank pattern 370 may block or prevent external light from entering elements located under the bank pattern 370 in the non-emission area NLA and the non-display area NDA.

As shown in FIGS. 8 and 11, the first wavelength conversion pattern 340, the second wavelength conversion pattern 350, and the light-transmitting pattern 330 may be located on the low refractive index layer 391. In some embodiments, the first wavelength conversion pattern 340, the second wavelength conversion pattern 350, and the light-transmitting pattern 330 may be located in the display area DA.

The light-transmitting pattern 330 may overlap the third emission area LA3 and the third light-emitting element ED3. The light-transmitting pattern 330 may be located in the space defined by the bank pattern 370 in the third light-transmitting area TA3.

In some embodiments, the light-transmitting pattern 330 may be formed as an island-shaped pattern as shown in FIG. 15.

The light-transmitting pattern 330 may transmit incident light. Exiting light LE provided by the third light-emitting element ED3 may be blue light as described above. The exiting light LE, which is blue light, passes through the light-transmitting pattern 330 and the third color filter 230 and exits (e.g., is emitted) to the outside of the display device 1. That is, the third light L3 emitted from the third emission area LA3 to the outside of the display device 1 may be blue light.

In some embodiments, the light-transmitting pattern 330 may include a third base resin 331 and may further include third scatterers 333 dispersed in the third base resin 331. Hereinafter, base resins, scatterers, and/or wavelength shifters which are included in the light-transmitting pattern 330 and the wavelength conversion patterns 340 and 350 are referred by the ordinal numbers of "first," "second," and "third" to distinguish between the elements of the light-transmitting pattern 330 and the wavelength conversion patterns 340 and 350. However, the ordinal numbers of "first," "second," and "third" as used herein to refer to the respective elements of the light-transmitting pattern 330 and the wavelength conversion patterns 340 and 350 are not limited thereto, and the order thereof may be changed to refer to the respective elements.

The third base resin 331 may be made of a material with a high light transmittance. In some embodiments, the third base resin 331 may be formed of an organic material. For example, the third base resin 331 may include an epoxy-based resin, an acrylic-based resin, a cardo-based resin, and/or an imide-based resin.

The third scatterers 333 may have a refractive index different from that of the third base resin 331 and may form an optical interface with the third base resin 331. For example, the third scatterers 333 may be light scatterers. The material of the third scatterers 333 is not particularly limited as long as they may scatter at least a part of the transmitted light. For example, the third scatterers 333 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include acrylic-based resins, urethane-based resins, etc. For example, the third scatterers 333 according to the embodiment may include titanium oxide ($TiO_2$).

The third scatterers 333 may scatter light in random directions regardless of the direction in which the incident light is coming, without substantially changing the wavelength of the light transmitted through the light-transmitting pattern 330. In some embodiments, the light-transmitting pattern 330 may be in direct contact with the bank pattern 370.

The first wavelength conversion pattern 340 may overlap the first emission area LA1, the first light-emitting element ED1, or the first light-transmitting area TA1.

In some embodiments, the first wavelength conversion pattern 340 may be located in a space defined by the bank pattern 370 in the first light-transmitting area TA1.

In some embodiments, the first wavelength conversion pattern 340 may be formed in an island shape pattern as shown in FIG. 15.

The first wavelength conversion pattern 340 may convert or shift the peak wavelength of the incident light into light of another peak wavelength and then emit the light. The wavelength conversion or shift by the first wavelength conversion pattern 340 may be performed through first wavelength shifters 345 which will be described in more detail below. In some embodiments, the first wavelength conversion pattern 340 may convert the exiting light LE provided from the first light-emitting element ED1 into red light having a peak wavelength in the range of 610 to 650 nm.

In some embodiments, the first wavelength conversion pattern 340 may include the first base resin 341 and the first wavelength shifters 345 dispersed in the first base resin 341, and may further include the first scatterers 343 dispersed in the first base resin 341.

The first base resin 341 may be made of a material with a high light transmittance. In some embodiments, the first base resin 341 may be formed of an organic material. In some embodiments, the first base resin 341 may be made of the same material as the third base resin 331, or may include at least one of the materials listed above as the examples of the constituent materials of the third base resin 331.

Examples of the first wavelength shifters 345 may include quantum dots, quantum bars, and/or phosphors. For example, quantum dots may be particulate matters that emit a specific color as electrons transition from the conduction band to the valence band.

The quantum dots may be a semiconductor nanocrystalline material. The quantum dots have a specific band gap depending on their compositions and size, and may absorb light and then emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combination(s) thereof.

The group II-VI compounds may be selected from the group consisting of: binary compounds selected from the group consisting of CdSe, CdTe, ZnS, ZnSe, ZnTe, ZnO, HgS, HgSe, HgTe, MgSe, MgS and a mixture thereof; ternary compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compounds may be selected from the group consisting of: binary compounds selected from the group consisting of GaN, GaP, GaAs, GaSb, AlN, AlP, AlAs, AlSb, InN, InP, InAs, InSb and a mixture thereof; ternary compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and a mixture thereof; and quaternary compounds selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compounds may be selected from the group consisting of: binary compounds selected from the group consisting of SnS, SnSe, SnTe, PbS, PbSe, PbTe and a mixture thereof; ternary compounds selected from the group consisting of SnSeS, SnSeTe, SnSTe, PbSeS, PbSeTe, PbSTe, SnPbS, SnPbSe, SnPbTe, and a mixture thereof; and quaternary compounds selected from the group consisting of SnPbSSe, SnPbSeTe, SnPbSTe and a mixture thereof. The group IV elements may be selected from the group consisting of Si, Ge and a mixture thereof. The group IV compounds may be binary compounds selected from the group consisting of SiC, SiGe and a mixture thereof.

The binary compounds, the ternary compounds, or the quaternary compounds may be present in the particles at a uniform concentration, or may be present in the same particles at partially different concentrations. In addition, they may have a core/shell structure in which one quantum dot is around (e.g., surrounds) another quantum dot. At the interface between the core and the shell, there may be a concentration gradient where the concentration of atoms in the shell may decrease toward the center of the core.

In some embodiments, the quantum dots may have a core-shell structure including a core comprising the aforementioned nanocrystals and a shell around (e.g., surrounding) the core. The shell of the quantum dots may serve as a protective layer for maintaining the semiconductor properties by preventing or reducing instances of chemical denaturation of the core and/or as a charging layer for imparting electrophoretic properties to the quantum dots. The shell may be either a single layer or multiple layers. At the interface between the core and the shell, a gradient where the concentration of atoms in the shell decreases toward the center of the core may exist. Examples of the shell of the quantum dot may include an oxide of a metal or a non-metal, a semiconductor compound, a combination thereof, etc.

For example, examples of the metal or non-metal oxide may include, but the present disclosure is not limited to, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, and/or ternary compounds such as $MgAl_2O_4$, $CoFe_2O_4$, $NiFe_2O_4$ and/or $CoMn_2O_4$.

Examples of the semiconductor compound may include, but the present disclosure is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc.

The light output from the first wavelength shifters 345 may have a full width at half maximum (FWHM) of the emission wavelength spectrum of approximately (about) 45 nm or less, approximately (about) 40 nm or less, or approximately (about) 30 nm or less. In this manner, the color purity and color reproducibility of the colors displayed by the display device 1 may be further improved. In addition, the light output from the first wavelength shifters 345 may travel in different directions regardless of the incidence direction of the incident light. In this way, the side visibility of the first color displayed in the first light-transmitting area TA1 may be improved.

A part of the exiting light LE provided from the first light-emitting element ED1 may not be converted into red light by the first wavelength shifters 345 but may pass through the first wavelength conversion pattern 340. Components of the exiting light LE which are not converted by the first wavelength conversion pattern 340 but are incident on the first color filter 231 may be blocked by the first color filter 231. On the other hand, red light that is converted from the exiting light LE by the first wavelength conversion pattern 340 passes through the first color filter 231 to exit (e.g., to be emitted) to the outside. That is to say, first light L1 exiting (e.g., emitted) to the outside of display device 1 through the first light-transmitting area TA1 may be red light.

The first scatterers 343 may have a refractive index different from that of the first base resin 341 and may form an optical interface with the first base resin 341. For example, the first scatterers 343 may be light scatterers. The first scatterers 343 are substantially identical to the third scatterers 333 described above; and, therefore, the redundant description will be omitted.

The second wavelength conversion pattern 350 may be located in the space defined by the bank pattern 370 in the second light-transmitting area TA2.

In some embodiments, the second wavelength conversion pattern 350 may be formed in an island shape pattern as shown in FIG. 15.

The second wavelength conversion pattern 350 may convert or shift the peak wavelength of the incident light into light of another peak wavelength and then emit the light. The wavelength conversion or shift by the second wavelength conversion pattern 350 may be performed through second wavelength shifters 355 which will be described in more detail below. In some embodiments, the second wavelength conversion pattern 350 may convert the exiting light LE provided from the second light-emitting element ED2 into green light in the range of approximately 510 to 550 nm.

In some embodiments, the second wavelength conversion pattern 350 may include a second base resin 351 and the second wavelength shifters 355 dispersed in the second base resin 351, and may further include second scatterers 353 dispersed in the second base resin 351.

The second base resin 351 may be made of a material with a high light transmittance. In some embodiments, the second base resin 351 may be formed of an organic material. In some embodiments, the second base resin 351 may be made of the same material as the third base resin 331, or may include at least one of the materials listed above as the examples of the constituent materials of the third base resin 331.

Examples of the second wavelength shifters 355 may include quantum dots, quantum bars, and/or phosphors. The second wavelength shifters 355 are substantially identical to the first wavelength shifters 345; and, therefore, the redundant description will be omitted.

In some embodiments, the first wavelength shifters 345 and the second wavelength shifters 355 may all be made of quantum dots. In such case, the particle size of the quantum dots forming the second wavelength shifters 355 may be smaller than the particle size of the quantum dots forming the first wavelength shifters 345.

The second scatterers 353 may have a refractive index different from that of the second base resin 351 and may form an optical interface with the second base resin 351. For example, the second scatterers 353 may be light scatterers. The second scatterers 353 are substantially identical to the first scatterers 343 described above; and, therefore, the redundant description will be omitted.

The exiting light LE emitted from the third light-emitting element ED3 may be provided to the second wavelength conversion pattern 350. The second wavelength shifters 355 may convert the exiting light LE provided from the third light-emitting element ED3 into green light having a peak wavelength in the range of approximately 510 to 550 nm.

A part of the exiting light LE, which is blue light, may not be converted into green light by the second wavelength shifters 355 but may pass through the second wavelength conversion pattern 350, which may be blocked by the second color filter 223. On the other hand, green light that is converted from the exiting light LE by the second wavelength conversion pattern 350 passes through the second color filter 233 to exit (e.g., to be emitted) to the outside. Accordingly, second light L2 exiting (e.g., emitted) to the outside of the display device 1 from the second light-transmitting area TA2 may be green light.

According to an embodiment, the thickness t1 of the wavelength conversion patterns 340 and 350 and the light-transmitting pattern 330 may be approximately (about) 8 μm to (about) 12 μm.

Meanwhile, in order to improve the light conversion efficiency of the wavelength conversion patterns 340 and 350 of the display device 1, the light conversion efficiency is defined. The light conversion efficiency of the wavelength conversion patterns 340 and 350 may be calculated by taking into account the light absorption rate (or absorbance) of the wavelength shifters 345 and 355 in the wavelength conversion patterns 340 and 350 (here, the light is the exiting light of the third color emitted from each of the emission areas LA1 and LA2 and part of the light whose wavelength is converted through the wavelength shifters 345 and 355), the quantum yield of the wavelength shifters 345 and 355, and extraction efficiency of the light whose wavelength is converted through the wavelength shifters 345 and 355. Part of the light whose wavelength is converted through the wavelength shifters 345 and 355 is light having a wavelength in the absorption wavelength range of the wavelength shifters 345 and 355, and refers to light that is absorbed again by the wavelength shifters 345 and 355. The extraction efficiency of the light whose wavelength is converted through the wavelength shifters 345 and 355 refers to a ratio of the light (e.g., intensity) exiting out through the light-transmitting areas TA1 and TA2 to the light (e.g., intensity) whose wavelength is converted through the wavelength shifters 345 and 355.

Among the factors involved in the light conversion efficiency of the wavelength conversion patterns 340 and 350, the quantum yield of the wavelength shifters 345 and 355 is a material intrinsic property of the wavelength shifters 345 and 355 (e.g., when the wavelength shifters 345 and 355 include InP, the quantum yield is 90% or more), and the extraction efficiency of the light whose wavelength is converted through the wavelength shifters 345 and 355 is determined by the structure of the substrate 30 including the light emitting elements. Therefore, in order to improve the light conversion efficiency of the wavelength conversion patterns 340 and 350 of the display device 1 according to the present disclosure, it is necessary to take into consideration the light absorption rate of the wavelength shifters 345 and 355 in the wavelength conversion patterns 340 and 350.

As one of the approaches for improving the light absorption rate of the wavelength shifters 345 and 355 in the wavelength conversion patterns 340 and 350, increasing the thickness t1 of the wavelength conversion patterns 340 and 350 and increasing the number of wavelength shifters 345 and 355 in the wavelength conversion pattern 340 may be considered. However, when the thickness t1 of the wavelength conversion patterns 340 and 350 increases, it is difficult to form an appropriate taper (e.g., a taper shaped) during the manufacturing process of the wavelength conversion patterns 340 and 350, so that it is difficult to realize a high resolution. Even when the absorbance of the wavelength shifters 345 and 355 is increased by increasing the thickness t1 of the wavelength conversion patterns 340 and 350, and accordingly, increasing the number of wavelength shifters 345 and 355, the thickness of the bank pattern 370 adjacent to the wavelength conversion patterns 340 and 350 is also increased as the thickness t1 of the wavelength conversion patterns 340 and 350 is increased, so that the light L1 and L2 whose wavelengths are converted through the wavelength shifters 345 and 355 may be absorbed by the adjacent bank pattern 370. Therefore, there is a limit in increasing the overall light conversion efficiency.

As one of the alternative approaches for improving the light absorption rate of the wavelength shifters 345 and 355 in the wavelength conversion patterns 340 and 350, increasing the density (or content or concentration) of the scatterers 343 and 353 in the wavelength conversion patterns 340 and 350 may be considered. When the density (or content or concentration) of the scatterers 343 and 353 in the wavelength conversion patterns 340 and 350 is increased, the scatterers 343 and 353 scatter third light that is not absorbed by the wavelength shifters 345 and 355, so that the light absorption rate of the wavelength shifters 345 and 355 may be increased. However, when the density (or content or concentration) of the scatterers 343 and 353 in the wavelength conversion patterns 340 and 350 is greater than or equal to a certain level, a phenomenon in which the dispersibility of the scatterers 343 and 353 is reduced may occur. The phenomenon of reduced dispersibility may include creaming (e.g., coagulation) between the scatterers 343 and 355 on an upper portion of the wavelength conversion patterns 340 and 350, sedimentation to a lower portion of the wavelength conversion patterns 340 and 350, flocculation and coalescence between the scatterers 343 and 353, etc.

Therefore, it is necessary to design the suitable content (e.g., amount or concentration) of the scatterers 343 and 353 to maximize or increase the light scattering effect while minimizing or reducing the above-described phenomenon of reduced dispersibility even when the density (or content or concentration) of the scatterers 343 and 353 in the wavelength conversion patterns 340 and 350 is increased.

A capping layer 393 may be located on the bank pattern 370, the light-transmitting pattern 330, the first wavelength conversion pattern 340, and the second wavelength conversion pattern 350. The capping layer 393 may cover the light-transmitting pattern 330, the first wavelength conversion pattern 340, and the second wavelength conversion pattern 350. In some embodiments, the capping layer 393 may also be located in the non-display area NDA. The capping layer 393 in the non-display area NDA (see, e.g., FIG. 1) may be in direct contact with the low refractive index layer 391, and may seal the light-transmitting pattern 330, the first wavelength conversion pattern 340, and the second wavelength conversion pattern 350. Accordingly, the capping layer 393 may prevent or reduce instances of the light-transmitting pattern 330, the first wavelength conversion pattern 340, and the second wavelength conversion pattern 350 being damaged or contaminated by impurities such as moisture and/or air introduced from the outside.

In some embodiments, the third capping layer 393 may be around (e.g., surround) the outer surfaces of the bank pattern 370 in the non-display area NDA. In addition, the third capping layer 393 may be in direct contact with the low refractive index capping layer 392 in the non-display area NDA.

In some embodiments, capping layer 393 may be made of an inorganic material. In some embodiments, the capping layer 393 may be made of the same material as the low refractive index layer 391 or may include at least one of those listed above as the materials of the low refractive index layer 391. When both (e.g., simultaneously) the low refractive index layer 391 and the capping layer 393 are made of an inorganic material, in the non-display area NDA, the low refractive index layer 391 and the capping layer 393 may be in direct contact with each other to form an inorganic-inorganic junction.

As described above, in the non-display area NDA, the sealing member 50 may be located between the color conversion substrate 30 and the display substrate 10.

The sealing member 50 may overlap the encapsulation layer 170. For example, the sealing member 50 may overlap the lower inorganic layer 171 and the upper inorganic layer 175 and may not overlap the organic layer 173. In some embodiments, the sealing member 50 may be in direct contact with the encapsulation layer 170. For example, the sealing member 50 may be located directly on the upper inorganic layer 175 and may be in direct contact with the upper inorganic layer 175.

In some embodiments, the upper inorganic layer 175 and the lower inorganic layer 171 located below the sealing member 50 may be extended to the outside of (e.g., beyond) the sealing member 50.

The sealing member 50 may overlap the light-blocking pattern 250, the first color filter 231, and the bank pattern 370 in the non-display area NDA. In some embodiments, the sealing member 50 may be in direct contact with the capping layer 393 covering the bank pattern 370.

The sealing member 50 may overlap the first gate metal WR1 including the lines and the like connected to the connection pad PD. As the sealing member 50 is disposed to overlap the first gate metal WR1, the width of the non-display area NDA may be reduced.

The filler 70 may be located in the space defined by the color conversion substrate 30, the display substrate 10, and the sealing member 50, as described above. In some embodiments, the filler 70 may be in direct contact with the capping layer 393 and the upper inorganic layer 175 of the encapsulation layer 170, as shown in FIGS. 8 and 11.

Hereinafter, the content (e.g., concentration) (%) of the wavelength shifters 345 and 355 and the content (e.g., concentration) (%) of the scatterers 343 and 353 for improving light conversion efficiency of the wavelength conversion patterns 340 and 350 of the display device 1 will be described in more detail with further reference to FIGS. 16 to 24 in conjunction to FIGS. 1 to 15.

Figure 16:
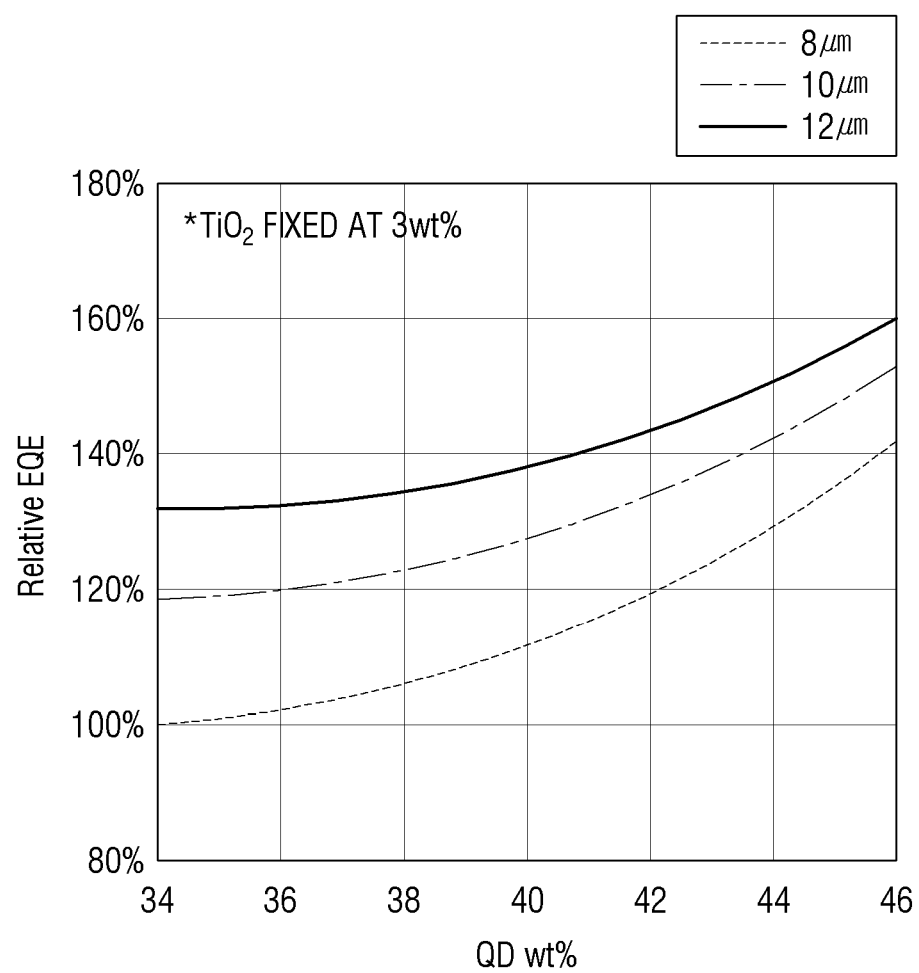
FIG. 16 is a graph showing the relative external quantum yield EQE of the second wavelength conversion pattern according to the concentration of the second wavelength shifters for each thickness of the second wavelength conversion pattern.
Figure 17:
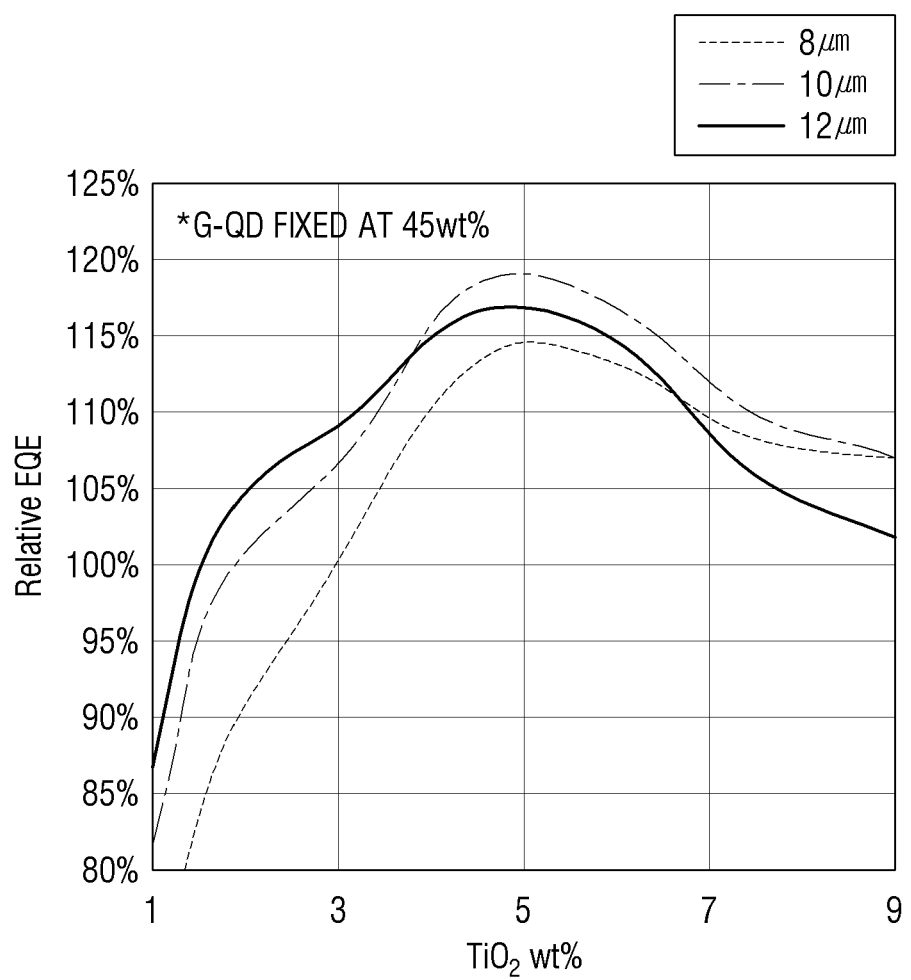
FIG. 17 is a graph showing the relative external quantum yield EQE of the second wavelength conversion pattern according to the concentration of the third scatterers for each thickness of the second wavelength conversion pattern.
Figure 18:
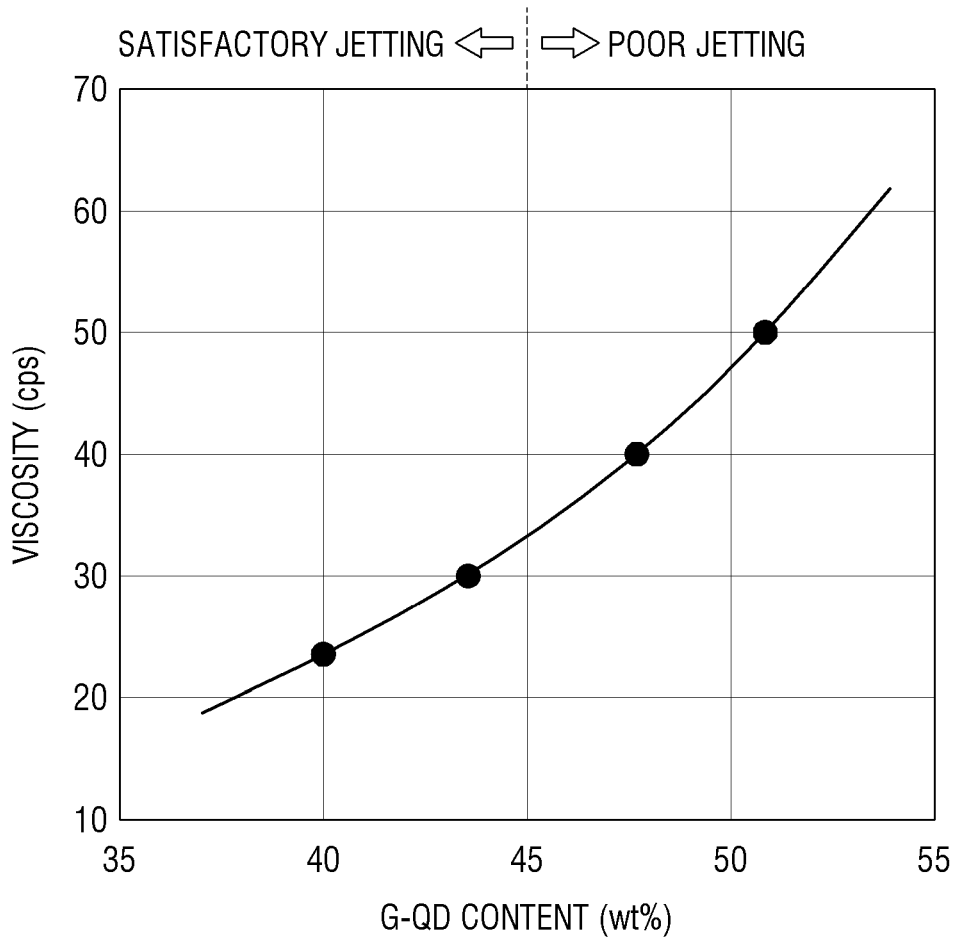
FIG. 18 is a graph showing the viscosity of a second wavelength conversion pattern material during the inkjet printing process according to the concentration of the second wavelength shifters of the second wavelength conversion pattern.
Figure 19:
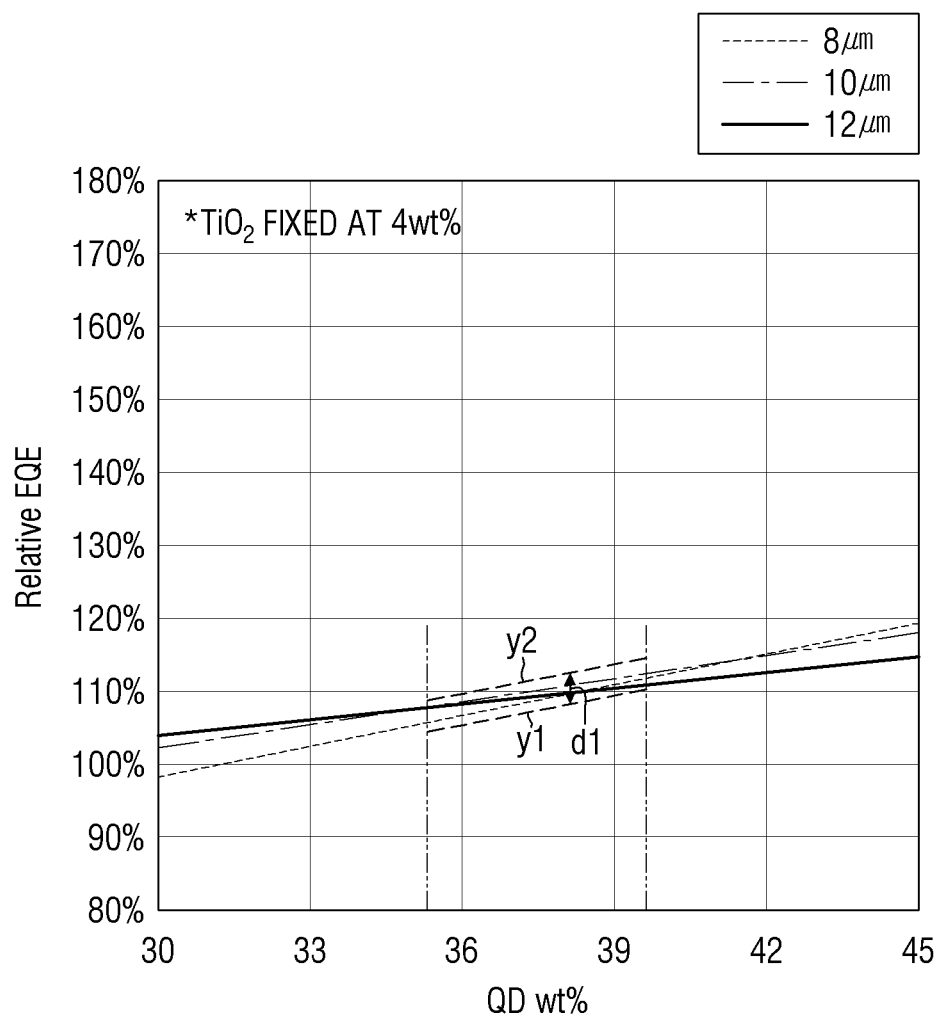
FIG. 19 is a graph showing the relative external quantum yield EQE of the first wavelength conversion pattern according to the concentration of the first wavelength shifters for each thickness of the first wavelength conversion pattern.
Figure 20:
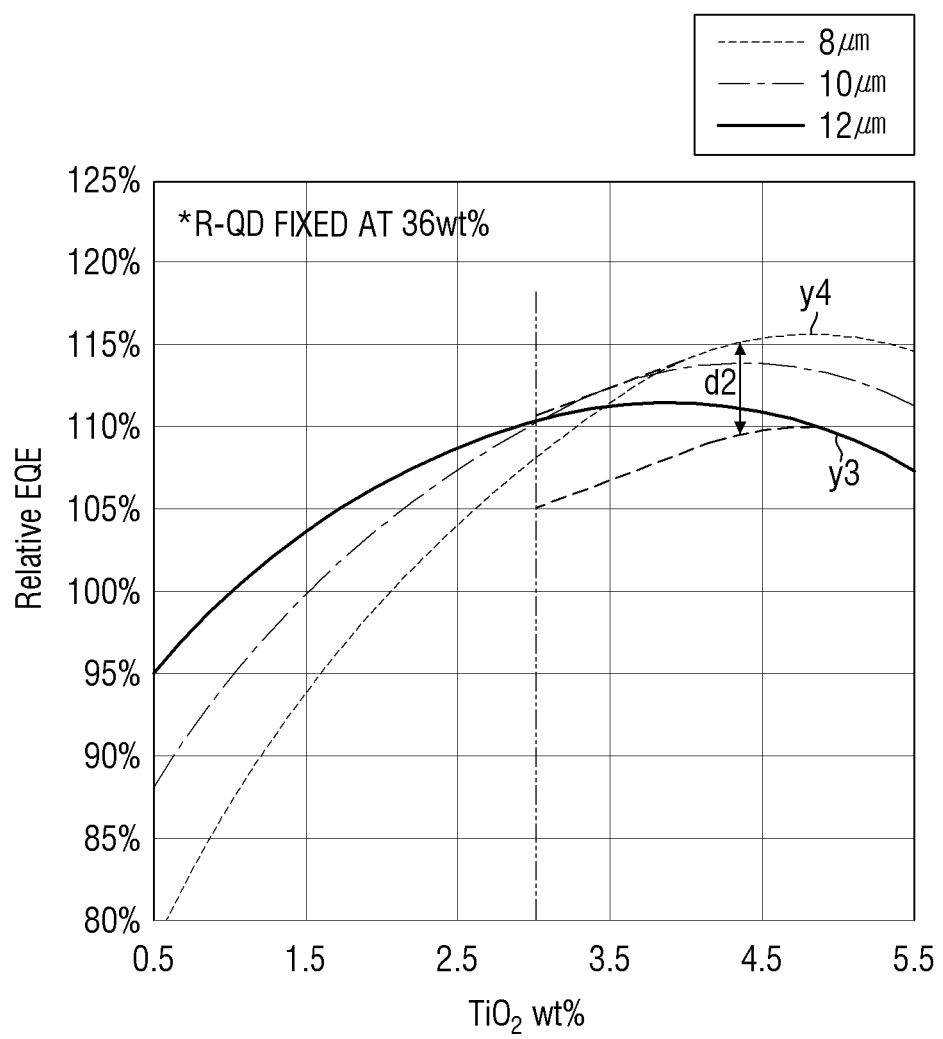
FIG. 20 is a graph showing the relative external quantum yield EQE of the first wavelength conversion pattern according to the concentration of the second scatterers for each thickness of the first wavelength conversion pattern.
Figure 21:
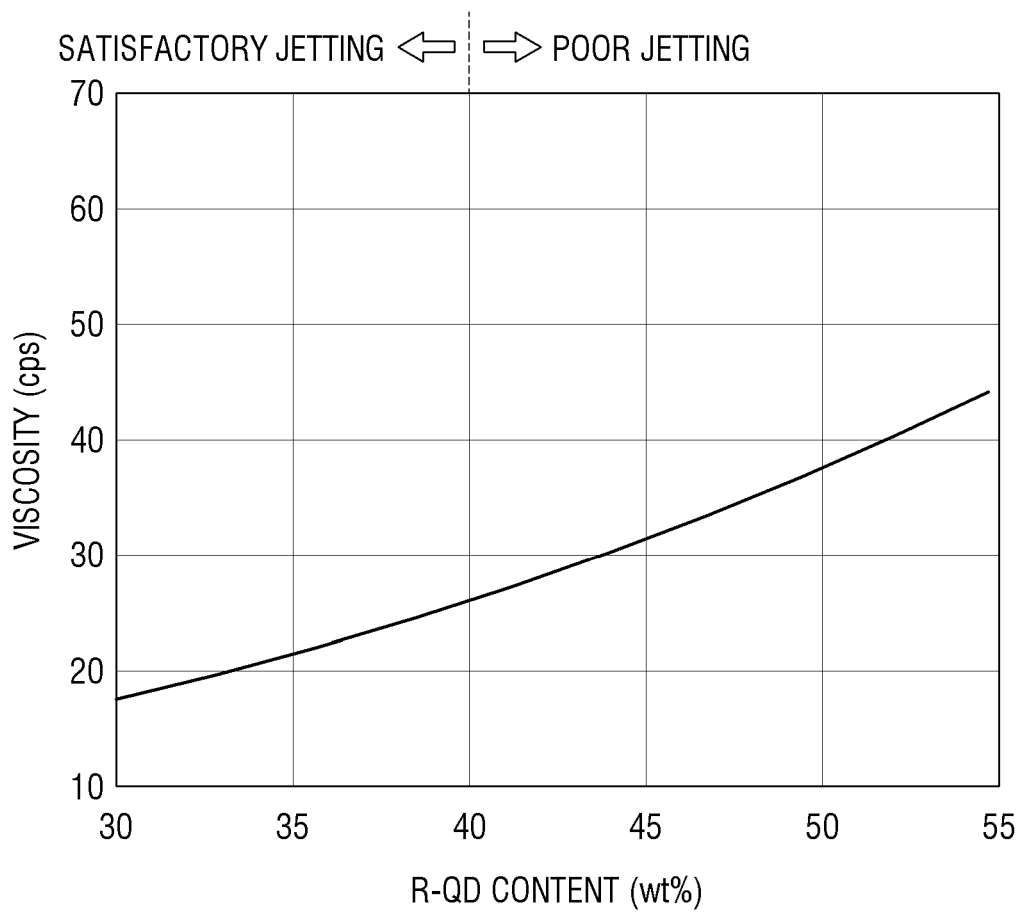
FIG. 21 is a graph showing the viscosity of a first wavelength conversion pattern material during the inkjet printing process according to the concentration of the first wavelength shifters of the first wavelength conversion pattern.
Figure 22:
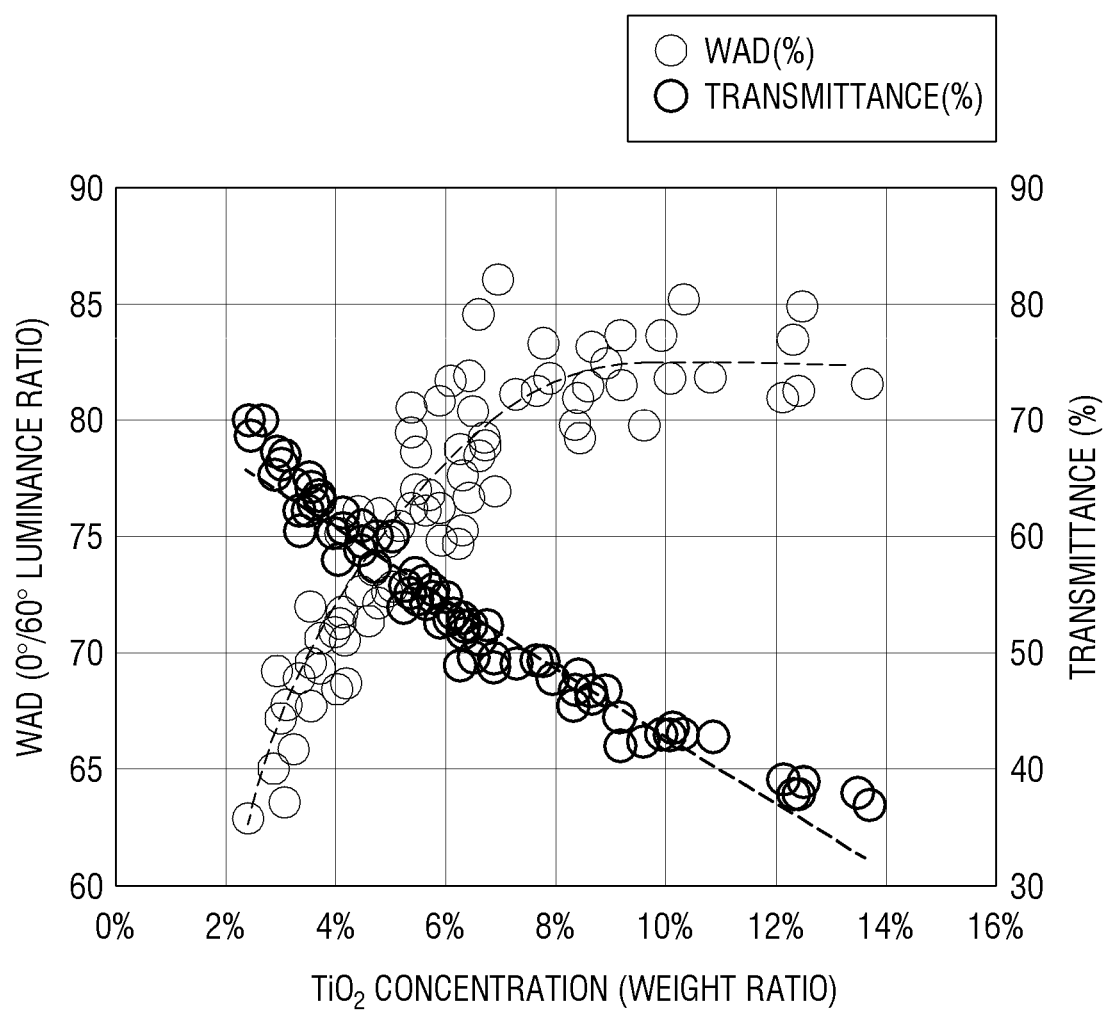
FIG. 22 is a graph showing a transmittance (%) and white angle difference (WAD) characteristics according to the concentration of the first scatters of the light-transmitting pattern.

FIG. 16 is a graph showing the relative external quantum yield EQE of the second wavelength conversion pattern according to the content (e.g., concentration) of the second wavelength shifters for each indicated thickness of the second wavelength conversion pattern. FIG. 17 is a graph showing the relative external quantum yield EQE of the second wavelength conversion pattern according to the content (e.g., concentration) of the third scatterers for each indicated thickness of the second wavelength conversion pattern. FIG. 18 is a graph showing the viscosity of a second wavelength conversion pattern material during the inkjet printing process according to the content (e.g., concentration) of the second wavelength shifters of the second wavelength conversion pattern. FIG. 19 is a graph showing the relative external quantum yield EQE of the first wavelength conversion pattern according to the content (e.g., concentration) of the first wavelength shifters for each indicated thickness of the first wavelength conversion pattern. FIG. 20 is a graph showing the relative external quantum yield EQE of the first wavelength conversion pattern according to the content (e.g., concentration) of the second scatterers for each indicated thickness of the first wavelength conversion pattern. FIG. 21 is a graph showing the viscosity of a first wavelength conversion pattern material during the inkjet printing process according to the content (e.g., concentration) of the first wavelength shifters of the first wavelength conversion pattern. FIG. 22 is a graph showing a transmittance (%) and white angle difference (WAD) characteristics according to the concentration of the first scatters of the light-transmitting pattern.

First, referring to FIGS. 8 and 16, the horizontal axis of the graph of FIG. 16 represents the content (e.g., concentration) (%) (or QD wt %) of the second wavelength shifters 355 of the second wavelength conversion pattern 350, and the vertical axis represents the relative external quantum yield EQE. Hereinafter, the content (e.g., concentration) (%)

of the material (e.g., the wavelength shifters 345 and 355 and the scatterers 333, 343 and 353) represents a weight ratio of the material in each of the wavelength conversion patterns 340 and 350 (e.g., a ratio between the weight of the material and the total weight of the respective wavelength conversion patterns 340 and 350), and the weight ratio may be measured through inductively coupled plasma mass spectrometer (ICP-MS). Inductively coupled plasma mass spectrometer (ICP-MS) is an analytic technique that analyzes the content (e.g., concentration) of each element in the wavelength conversion patterns 340 and 350 and the light-transmitting pattern 330 to obtain the content (e.g., concentration) of the wavelength shifters 345 and 355 and the scatterers 333, 343, and 353. This analytic technique is known to those skilled in the art, and thus detailed description thereof will be omitted. In addition, thermogravimetric analysis (TGA) and/or the like may be utilized. Thermogravimetric analysis (TGA) is also known to those skilled in the art, and thus detailed description thereof will be omitted.

Furthermore, the external quantum yield EQE has a meaning similar to the light conversion efficiency of the wavelength conversion patterns 340 and 350. In order to easily show a change in the light conversion efficiency according to the variables on the graph, that is, the thickness t1 of the second wavelength conversion pattern 350 and the change in the content (wt %) (e.g., concentration) of the second wavelength shifters 355 in FIG. 16, the external quantum yield of the second wavelength conversion pattern 350 is assumed to be 100% when the content (wt %) (e.g., concentration) of the scatter 353 is 3 (i.e., 3 wt %), the content (wt %) (e.g., concentration) of the second wavelength shifters 355 is 34 (i.e., 34 wt %), and the thickness t1 is 8 μm, and the external quantum efficiency of the second wavelength conversion pattern 350 according to the thickness t1 and the change in the content (wt %) (e.g., concentration) of the second wavelength shifter 355 is presented relative to the external quantum yield of 100%.

Similarly, in FIG. 17, the external quantum yield is assumed to be 100% when the content (wt %) (e.g., concentration) of the second wavelength shifters 355 is 45 (i.e., 45 wt %), the content (wt %) (e.g., concentration) of the scatterers 353 is 1.5 (i.e., 1.5 wt %), and the thickness t1 is 12 μm, and in FIG. 18, the external quantum yield is assumed to be 100% when the content (wt %) (e.g., concentration) of the scatterers 343 is 4 (i.e., 4 wt %), the content (wt %) (e.g., concentration) of the first wavelength shifters 345 is 31 (i.e., 31 wt %), and the thickness t1 is 8 μm.

In FIG. 19, the external quantum yield is assumed to be 100% when the content (wt %) (e.g., concentration) of the first wavelength shifters 345 is 36 (i.e., 36 wt %), the content (wt %) (e.g., concentration) of the scatterers 353 is 1.0 (i.e., 1.0 wt %), and the thickness t1 is 12 μm.

As may be seen in FIG. 16, the content (wt %) (e.g., concentration) of the second wavelength shifters 355 is proportional to the light conversion efficiency. That is, the light conversion efficiency increases when the amount of the second wavelength shifters 355 increases. In addition, it may be seen that the thickness t1 of the second wavelength conversion pattern 350 is also proportional to the light conversion efficiency. That is, the light conversion efficiency increases when the thickness t1 of the second wavelength conversion pattern 350 increases. The second wavelength shifters 355 according to an embodiment may have a lower light absorption rate than the first wavelength shifters 345. Thus, when the number of second wavelength shifters 355 is increased by increasing the density (e.g., concentration or weight ratio) of the second wavelength shifters 355 in the second wavelength conversion pattern 350 or increasing the thickness t1 of the second wavelength conversion pattern 350, the light conversion efficiency of the second wavelength conversion pattern 350 may be increased. Furthermore, it may be seen that, regardless of the thickness (t1) of the second wavelength conversion pattern 350, the light conversion efficiency of the second wavelength shifters 355 of the second wavelength conversion pattern 350 is sharply increased when the content (wt %) (e.g., concentration) of the second wavelength shifter 355 is 40 (i.e., 40 wt %) or more. Accordingly, the content (wt %) (e.g., concentration) of the second wavelength shifters 355 is preferably 40 (i.e., 40 wt %) or more.

Then, referring to FIGS. 8 and 17, the horizontal axis of FIG. 17 represents the content (e.g., amount) ($TiO_2$, wt %) of the second scatterers 353, and the vertical axis represents the relative external quantum yield (relative EQE) of the second wavelength conversion pattern 350. As may be seen in FIG. 17, in a section where the content (e.g., concentration) ($TiO_2$, wt %) of the second scatterers 353 is 1 to 5 (i.e., 1 to 5 wt %), the light conversion efficiency is increased regardless of the thickness t1 of the second wavelength conversion pattern 350, and it may be seen that the light conversion efficiency of the second wavelength conversion pattern 350 decreases from a section in which the content (e.g., concentration) ($TiO_2$, wt %) of the second scatterers 353 exceeds 5 (i.e., 5 wt %). As described above, in the section where the content (e.g., concentration) ($TiO_2$, wt %) of the second scatterers 353 is 1 to 5 (i.e., 1 to 5 wt %), the third light (e.g., blue light) that is not absorbed by the second wavelength shifters 355 is scattered by the second scatterers 353 to thereby increase the light absorption rate of the second wavelength shifters 355, but from the section where the content (e.g., concentration) ($TiO_2$, wt %) of the second scatterers 353 exceeds 5 (i.e., 5 wt %), the phenomenon of reduced dispersibility between the second scatterers 353 occurs, which may result in a reduction in the light conversion efficiency of the second wavelength conversion pattern 350. Furthermore, as shown in FIG. 17, for each thickness t1 (8 μm, 10 μm, and 12 μm) of the second wavelength conversion pattern 350, in a section where the content (wt %) (e.g., concentration) of the second scatterers 353 is 2 (i.e., 2 wt %) to less than 3 (i.e., 3 wt %), an increased rate of the relative external quantum yield of the second wavelength conversion pattern 350 according to the content (wt %) (e.g., concentration) of the second scatterers 353 is gradually reduced, while in a section where the content (wt %) (e.g., concentration) of the second scatterers 353 is greater than or equal to 3 (i.e., 3 wt %) and less than or equal to 5 (i.e., 5 wt %), an increased rate of the relative external quantum yield of the second wavelength conversion pattern 350 according to the content (wt %) (e.g., concentration) of the second scatterers 353 gradually increases. Accordingly, the content (wt %) (e.g., concentration) of the second scatterers 353 of the second wavelength conversion pattern 350 is preferably 3 to 5 (i.e., 3 to 5 wt %).

Referring to FIGS. 8 and 18, the horizontal axis of FIG. 18 represents the content (e.g., concentration) (G-QD, wt %) of the second wavelength shifters 355 of the second wavelength conversion pattern 350, and the vertical axis represents the viscosity (cps) before curing of the second wavelength conversion pattern material when the second wavelength conversion pattern 350 is formed through the inkjet printing process. In general, in the case of jetting the second wavelength conversion pattern material through the inkjet printing process, when the viscosity (cps) of the second wavelength conversion pattern material is approximately (about) 35 cps or more, it becomes difficult for the second wavelength conversion pattern material having a high viscosity to be ejected (or jetted) from a nozzle of a printing head utilized in the inkjet printing process, so that jetting failure of the second wavelength conversion pattern material occurs. Therefore, the content (wt %) (e.g., concentration) of the second wavelength shifters 355 according to an embodiment is preferably approximately (about) 45 (i.e., 45 wt %) or less.

Subsequently, the horizontal axis of the graph of FIG. 19 represents the content (e.g., concentration) (%) (or QD wt %) of the first wavelength shifters 345 of the first wavelength conversion pattern 340, and the vertical axis represents the relative external quantum yield EQE. In FIG. 19, the content (wt %) (e.g., concentration) of the first scatterers 343 ($TiO_2$) is fixed to 4 (i.e., 4 wt %).

As may be seen in FIG. 19, the content (wt %) (e.g., concentration) of the first wavelength shifters 345 is proportional to the relative external quantum yield. In addition, it may be seen that the thickness t1 of the first wavelength conversion pattern 340 is also proportional to the relative external quantum efficiency. As in the second wavelength conversion pattern 350, when the number of first wavelength shifters 345 is increased by increasing the density of the first wavelength shifters 345 in the first wavelength conversion pattern 340 or increasing the thickness t1 of the first wavelength conversion pattern 340, the relative external quantum yield of the first wavelength conversion pattern 340 may be increased.

Furthermore, it is preferable for the first wavelength conversion pattern 340 to have a uniform light conversion efficiency for the range of the thickness t1 (8 μm to 12 μm) of the first wavelength conversion pattern 340 while increasing the light conversion efficiency of the first wavelength conversion pattern 340. Considering this fact, the content (wt %) (e.g., concentration) of the first wavelength shifters 345 is preferably 35 to 40 (i.e., 35 to 40 wt %). Here, the uniform light conversion efficiency for the range (8 μm to 12 μm) of the thickness t1 of the first wavelength conversion pattern 340 refers to that a difference in the relative external quantum yield according to the thickness t1 (8 μm to 12 μm) of the first wavelength conversion pattern 340 at a specific content (wt %) (e.g., concentration) of the first wavelength shifters 345 is approximately 2% or less (a variation rate d1 of the relative external quantum yield between y2 and y1 is 2% or less).

Then, referring to FIGS. 8 and 20, the horizontal axis of FIG. 20 represents the content (e.g., concentration) ($TiO_2$, wt %) of the first scatterers 343, and the vertical axis represents the relative external quantum yield (relative EQE) of the first wavelength conversion pattern 340. The content (e.g., concentration) (R-GD, wt %) of the first wavelength shifters 345 is fixed to 36 (e.g., 34 wt %). As may be seen in FIG. 20, when the content (e.g., concentration) ($TiO_2$, wt %) of the first scatterers 343 is 1 to 3.5 (e.g., 1 to 3.5 wt %), the light conversion efficiency is increased regardless of the thickness t1 of the first wavelength conversion pattern 340; when the thickness t1 of the first wavelength conversion pattern 340 is 10 μm, the relative external quantum yield is saturated at approximately (about) 4.5%; and when the thickness t1 of the first wavelength conversion pattern 340 is 8 μm, the relative external quantum yield is saturated at approximately (about) 5.0%. Furthermore, it is preferable for the first wavelength conversion pattern 340 to have a uniform light conversion efficiency for the range of the thickness t1 (8 μm to 12 μm) of the first wavelength conversion pattern 340 while increasing the light conversion efficiency of the first wavelength conversion pattern 340. The content (wt %) (e.g., concentration) of the first scatterers 343 of the first wavelength conversion pattern 340 satisfying such condition is preferably 3 to 6 (e.g., 3 to 6 wt %), more preferably, 3 to 5 (e.g., 3 to 5 wt %). In an embodiment, a range in which the variation rate of the relative external quantum yield according to the thickness t1 of the first wavelength conversion pattern 340 may be minimized or reduced may be about 3 to 6 (e.g., 3 to 6 wt %), more preferably 3 to 5 (e.g., 3 to 5 wt %). Here, it is preferable that the variation rate of the relative external quantum yield is adjusted to 5% or less (the variation rate d2 of the relative external quantum efficiency between y4 and y3 is 5% or less).

Referring to FIGS. 8 and 21, the horizontal axis of FIG. 21 represents the content (e.g., concentration) (R-QD, wt %) of the first wavelength shifters 345 of the first wavelength conversion pattern 340, and the vertical axis represents the viscosity (cps) before curing of the first wavelength conversion pattern material when the first wavelength conversion pattern 340 is formed through the inkjet printing process. In general, in the case of jetting the first wavelength conversion pattern material through the inkjet printing process, when the viscosity (cps) of the first wavelength conversion pattern material is approximately 28 cps or more, it becomes difficult for the first wavelength conversion pattern material having a high viscosity to be ejected (or jetted) from a nozzle of a printing head utilized in the inkjet printing process, so that jetting failure of the first wavelength conversion pattern material occurs. Therefore, the content (wt %) (e.g., concentration) of the first wavelength shifters 345 according to an embodiment is preferably approximately 40 (e.g., 40 wt %) or less.

Meanwhile, under the condition that the content (wt %) (e.g., concentration) of the second wavelength shifters 355 is greater than the content (wt %) (e.g., concentration) of the first wavelength shifters 345, the content (wt %) (e.g., concentration) of the first wavelength shifters 345 may be preferably 35 to 40 (e.g., 35 to 40 wt %) or less, and the content (wt %) (e.g., concentration) of the second wavelength shifters 355 is preferably 40 to 45 (e.g., 40 to 45 wt %). The content (wt %) (e.g., concentration) of the second wavelength shifters 355 is greater than the content (wt %) (e.g., concentration) of the first wavelength shifters 345, as described above, because the absorbance of the second wavelength shifters 355 for the third light is lower than the absorbance of the first wavelength shifters 345 for the third light. That is, by designing the content (wt %) (e.g., concentration) of the second wavelength shifters 355 to be greater than the content (wt %) (e.g., concentration) of the first wavelength shifters 345, the lower absorbance of the second wavelength shifters 355 for the third light compared to the absorbance of the first wavelength shifters 345 for the third light may be compensated for. In some embodiments, in order to compensate for the lower absorbance of the second wavelength shifters 355 for the third light compared to the absorbance of the first wavelength shifters 345 for the third light, a ratio between the content (wt %) (e.g., concentration) of the first wavelength shifters 345 in the first wavelength conversion pattern 340 and the content (wt %) (e.g., concentration) of the second wavelength shifters 355 in the second wavelength conversion pattern 350 may be 1:1.1 to 1:1.3.

Next, referring to FIGS. 8 and 22, the horizontal axis of FIG. 22 represents the concentration (or content (e.g., amount), weight ratio (wt %)) of the first scatterers ($TiO_2$) 333, and the vertical axis represents a ratio (white angle difference (WAD) characteristics) between luminance in the case of an angle between a line perpendicular to the display surface of the display device 1 in the third light-transmitting area TA3 and the incident path of white light being 0° and luminance in the case of an angle between a line perpendicular to the display surface of the display device 1 in the third light-transmitting area TA3 and the incident path of white light being 60°, and transmittance (%) in the third light transmitting area TA3.

As may be seen in FIG. 22, as the content (wt %) (e.g., concentration) of the third scatterers 333 increases, the ratio (hereinafter referred to as the front-side luminance ratio (%)) between luminance in the case of the angle between the line perpendicular to the display surface of the display device 1 and the incident path of white light being 0° and luminance in the case of the angle between the line perpendicular to the display surface of the display device 1 and the incident path of the white light being 60° is increased, and as the content (wt %) (e.g., concentration) of the third scatterers 333 increases, the transmittance (%) in the third light-transmitting area TA3 decreases. The decrease in the transmittance (%) in the third light transmitting area TA3 according to the increase in the content (wt %) (e.g., concentration) of the third scatterers 333 may be caused by the transparency of the light-transmitting pattern 330 that decreases as the content (wt %) (e.g., concentration) of the third scatterers 333 in the light-transmitting pattern 330 increases. Also, the increase in the front-side luminance ratio according to the increase in the content (wt %) (e.g., concentration) of the third scatterers 333 may be caused by the increasing degree of scattering of the third light incident from the third emission area LA by the third scatterers 333. In the third light-transmitting area TA3 of the display device 1 according to an embodiment, the front-side luminance ratio (%) is preferably 70 or more, and the transmittance (%) in the third light-transmitting area TA3 is preferably 68 or more. The content (wt %) (e.g., concentration) of the third scatterers 333 satisfying such conditions may be 4.5 to 9 (e.g., 4.5 to 9 wt %). In some embodiments, a ratio between the content (wt %) (e.g., concentration) of the third scatterers 333 in the light-transmitting pattern 330 and the content (wt %) (e.g., concentration) of the second scatterers 353 in the second wavelength conversion pattern 350 and a ratio between the content (wt %) (e.g., concentration) of the third scatterers 333 in the light-transmitting pattern 330 and the content (wt %) (e.g., concentration) of the first scatterers 343 in the first wavelength conversion pattern 340 may be 1:1.2 to 1:1.7, respectively. That is, when the ratio between the content (wt %) (e.g., concentration) of the third scatterers 333 in the light-transmitting pattern 330 and the content (wt %) (e.g., concentration) of the second scatterers 353 in the second wavelength conversion pattern 350 and the ratio between the content (wt %) (e.g., concentration) of the third scatterers 333 in the light-transmitting pattern 330 and the content (wt %) (e.g., concentration) of the first scatterers 343 in the first wavelength conversion pattern 340 are each 1:1.2 or more, a high front-side luminance ratio may be achieved in the third light-transmitting area TA3 of the display device 1. When the ratio between the content (wt %) (e.g., concentration) of the third scatterers 333 in the light-transmitting pattern 330 and the content (wt %) (e.g., concentration) of the second scatterers 353 in the second wavelength conversion pattern 350 and the ratio between the content (wt %) (e.g., concentration) of the third scatterers 333 in the light-transmitting pattern 330 and the content (wt %) (e.g., concentration) of the first scatterers 343 in the first wavelength conversion pattern 340 are each 1:1.7 or less, a transmittance (%) above a certain level may be achieved in terms of light transmission efficiency in the third light-transmitting area TA3.

According to embodiments of the present invention, the light conversion efficiency of the wavelength conversion pattern may be improved.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

However, the effects of the embodiments are not restricted to the one set forth herein. The above and other effects of the embodiments will become more apparent to one of daily skill in the art to which the embodiments pertain by referencing the claims.

While the present disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims, and equivalents thereof.

What is claimed is:

1. A display device comprising:
a substrate comprising a first emission area, a second emission area, and a third emission area;
a first wavelength conversion pattern overlapping the first emission area;
a second wavelength conversion pattern overlapping the second emission area; and
a light-transmitting pattern overlapping the third emission area,
wherein:
the first wavelength conversion pattern comprises first wavelength shifters configured to convert a first light into a second light, and first scatterers,
the second wavelength conversion pattern comprises second wavelength shifters configured to convert the first light into a third light, and second scatterers, and
a ratio between a concentration of the first wavelength shifters in the first wavelength conversion pattern and a concentration of the second wavelength shifters in the second wavelength conversion pattern is 1:1.1 to 1:1.3.

2. The display device of claim 1, wherein a weight amount of the second wavelength shifters is greater than a weight amount of the first wavelength shifters.

3. The display device of claim 1, wherein an absorbance of the second wavelength shifters for the third light is less than an absorbance of the first wavelength shifters for the second light.

4. The display device of claim 1, wherein the concentration of the second scatterers in the second wavelength conversion pattern is 3 wt % to 5 wt % based on a total weight of the second wavelength conversion pattern.

5. The display device of claim 4, wherein the concentration of the first scatterers in the first wavelength conversion pattern is 3 wt % to 6 wt % based on a total weight of the first wavelength conversion pattern.

6. The display device of claim 1, wherein the light-transmitting pattern comprises third scatterers and a concentration of the third scatterers in the light-transmitting pattern is greater than each of the concentration of the second scatterers in the second wavelength conversion pattern and the concentration of the first scatterers in the first wavelength conversion pattern.

7. The display device of claim 6, wherein the concentration of the third scatterers in the light-transmitting pattern is 4.5 wt % to 9 wt %.

8. The display device of claim 6, wherein each of a ratio between the concentration of the third scatterers in the light-transmitting pattern and the concentration of the second scatterers in the second wavelength conversion pattern and a ratio between the concentration of the third scatterers in the light-transmitting pattern and the concentration of the first scatterers in the first wavelength conversion pattern is 1:1.2 to 1:1.7.

9. The display device of claim 6, wherein a ratio between luminance in the case of an angle between a line normal to a display surface of the display device and an incident path of white light being 0° and luminance in the case of an angle between the line normal to the display surface of the display device and an incident path of white light being 60° is 75% or more.

10. The display device of claim 1, wherein a thickness of each of the first wavelength conversion pattern and the second wavelength conversion pattern is 8 µm to 12 µm.

11. The display device of claim 1, wherein the concentration of the first wavelength shifters and the concentration of the second wavelength shifters are each measured through inductively coupled plasma mass spectrometer (ICP-MS).

12. A substrate comprising light emitting elements, the substrate comprising:
a first substrate comprising a first emission area, a second emission area, and a third emission area;
a first wavelength conversion pattern overlapping the first emission area;
a second wavelength conversion pattern overlapping the second emission area; and
a light-transmitting pattern overlapping the third emission area,
wherein:
the first wavelength conversion pattern comprises first wavelength shifters configured to convert a first light into a second light, and first scatterers,
the second wavelength conversion pattern comprises second wavelength shifters configured to convert the first light into a third light, and second scatterers,
a concentration of the second wavelength shifters in the second wavelength conversion pattern is 40 wt % to 45 wt %, and
a concentration of the first wavelength shifters in the first wavelength conversion pattern is 35 wt % to 40 wt %.

13. The substrate of claim 12, wherein a weight amount of the second wavelength shifters in the second wavelength pattern is greater than a weight amount of the first wavelength shifters in the first wavelength conversion pattern.

14. The substrate of claim 13, wherein an absorbance of the second wavelength shifters for the third light is less than an absorbance of the first wavelength shifters for the second light.

15. The substrate of claim 12, wherein the concentration of the second scatterers in the second wavelength conversion pattern is 3 wt % to 5 wt % and the concentration of the first scatterers in the first wavelength conversion pattern is 3 wt % to 6 wt %.

16. The substrate of claim 12, wherein the light-transmitting pattern comprises third scatterers and a concentration of the third scatterers in the light-transmitting pattern is greater than each of the concentration of the second scatterers in the second wavelength conversion pattern and the concentration of the first scatterers in the first wavelength conversion pattern.

17. The substrate of claim 16, wherein the concentration of the third scatterers in the light-transmitting pattern is 4.5 wt % to 9 wt %.

18. The substrate of claim 16, wherein each of a ratio between the concentration of the third scatterers in the light-transmitting pattern and the concentration of the second scatterers in the second wavelength conversion pattern and a ratio between the concentration of the third scatterers in the light-transmitting pattern and the concentration of the first scatterers in the first wavelength conversion pattern is 1:1.2 to 1:1.7.

19. The substrate of claim 16, wherein a ratio between luminance in the case of an angle between an incident path of white light and a display surface of the substrate being 0° and luminance in the case of an angle between an incident path of white light and the display surface of the substrate being 60° is 75% or more.

20. The substrate of claim 12, wherein the concentration of the first wavelength shifters and the concentration of the second wavelength shifters are each measured through inductively coupled plasma mass spectrometer (ICP-MS).

21. A display device comprising:
    a first substrate on which a first light-transmitting area, a second light-transmitting area, and a third light-transmitting area are defined and which has a first surface and a second surface facing oppositely away from the first surface;
    a first wavelength conversion pattern on the first surface of the first substrate and overlapping the first light-transmitting area;
    a second wavelength conversion pattern on the first surface of the first substrate and overlapping the second light-transmitting area; and
    a light-transmitting pattern on the first surface of the first substrate and overlapping the third light-transmitting area,
    wherein:
    the first wavelength conversion pattern comprises a first base resin, first wavelength shifters dispersed in the first base resin and configured to convert a first light into a second light, and first scatterers dispersed in the first base resin,
    the second wavelength conversion pattern comprises a second base resin, second wavelength shifters dispersed in the second base resin and configured to convert the first light into a third light, and second scatterers dispersed in the second base resin,
    the light-transmitting pattern comprises a third base resin and third scatterers dispersed in the third base resin,
    a thickness of each of the first wavelength conversion pattern and the second wavelength conversion pattern is 8 μm to 12 μm,
    a ratio between a concentration of the first wavelength shifters in the first wavelength conversion pattern and a concentration of the second wavelength shifters in the second wavelength conversion pattern is 1:1.1 to 1:1.3, the concentration of each of the first wavelength shifters and the second wavelength shifters being measured through inductively coupled plasma mass spectrometer (ICP-MS).

22. The display device of claim 21, wherein an absorbance of the second wavelength shifters for the third light is less than an absorbance of the first wavelength shifters for the second light.

23. The display device of claim 21, wherein the concentration of the second scatterers in the second wavelength conversion pattern is 3 wt % to 5 wt % and the concentration of the first scatterers in the first wavelength conversion pattern is 3 wt % to 6 wt %.

24. The display device of claim 21, wherein a concentration of the third scatterers in the light-transmitting pattern is greater than each of the concentration of the second scatterers in the second wavelength conversion pattern and the concentration of the first scatterers in the first wavelength conversion pattern and the concentration of the third scatterers in the light-transmitting pattern is 4.5 wt % to 9 wt %.

25. The display device of claim 23, wherein each of a ratio between the concentration of the third scatterers in the light-transmitting pattern and the concentration of the second scatterers in the second wavelength conversion pattern and a ratio between the concentration of the third scatterers in the light-transmitting pattern and the concentration of the first scatterers in the first wavelength conversion pattern is 1:1.2 to 1:1.7.

26. The display device of claim 24, wherein a ratio between luminance in the case of an angle between a line normal to a display surface of the display device and an incident path of white light being 0° and luminance in the case of an angle between the line normal to the display surface of the display device and an incident path of white light being 60° is 75% or more.

* * * * *